(12) United States Patent
Rezeq

(10) Patent No.: US 7,715,490 B2
(45) Date of Patent: May 11, 2010

(54) SPECTRAL EMISSION SHAPING SIGMA DELTA MODULATOR FOR WIRELESS APPLICATIONS

(75) Inventor: Sameh S. Rezeq, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 786 days.

(21) Appl. No.: 11/370,580

(22) Filed: Mar. 8, 2006

(65) Prior Publication Data
US 2006/0203922 A1   Sep. 14, 2006

Related U.S. Application Data

(60) Provisional application No. 60/660,397, filed on Mar. 9, 2005.

(51) Int. Cl.
*H04L 27/00* (2006.01)

(52) U.S. Cl. .................. 375/295; 375/297; 375/312; 375/300; 455/127.1; 455/127.2; 455/126; 341/143; 341/150; 331/36 C; 331/16

(58) Field of Classification Search .......... 341/143, 341/150; 375/308, 296; 455/127.2, 127.1, 455/126; 331/36 C, 16
See application file for complete search history.

(56) References Cited

U.S. PATENT DOCUMENTS

| 5,917,440 | A  | * | 6/1999  | Khoury ........................ 341/143 |
| 6,741,197 | B1 | * | 5/2004  | Melanson .................... 341/150 |
| 6,791,422 | B2 | * | 9/2004  | Staszewski et al. ......... 331/36 C |
| 6,809,598 | B1 | * | 10/2004 | Staszewski et al. .......... 331/16 |
| 2005/0271161 | A1 | * | 12/2005 | Staszewki et al. ........... 375/308 |
| 2005/0287967 | A1 | * | 12/2005 | Hung et al. ............... 455/127.2 |
| 2006/0038710 | A1 | * | 2/2006  | Staszewski et al. ......... 341/143 |
| 2006/0119493 | A1 | * | 6/2006  | Tal et al. ................... 341/143 |
| 2007/0129029 | A1 | * | 6/2007  | Litmanen ................... 455/126 |
| 2007/0129030 | A1 | * | 6/2007  | Litmanen et al. ......... 455/127.1 |

* cited by examiner

*Primary Examiner*—Sudhanshu C Pathak
(74) *Attorney, Agent, or Firm*—Ronald O. Neerings; Wade James Brady, III; Frederick J. Telecky, Jr.

(57) ABSTRACT

A novel sigma delta amplitude modulator having a noise transfer function adapted to shift quantization noise outside at least one frequency band of interest. In one embodiment, the sigma delta amplitude modulator includes a programmable order low pass stage. In a second embodiment, the sigma delta amplitude modulator incorporates comb filtering wherein each comb filter comprises a plurality of fingers to permit greater programmability in the frequency location of notches. A polar transmitter incorporating the sigma delta amplitude modulator is presented that shapes the spectral emissions of the digitally-controlled power amplifier such that they are significantly and sufficiently attenuated in one or more desired frequency bands.

27 Claims, 17 Drawing Sheets

SPECTRAL EMISSION SHAPING SIGMA DELTA MODULATOR FOR WIRELESS APPLICATIONS

REFERENCE TO PRIORITY APPLICATION

This application claims priority to U.S. Provisional Application Ser. No. 60/660,397, filed Mar. 9, 2005, entitled "Sigma-Delta Amplitude Modulation", incorporated herein by reference in its entirety.

REFERENCE TO RELATED APPLICATION

This application is related to U.S. application Ser. No. 11/297,524, filed Dec. 7, 2005, entitled "Digital Transmitter Incorporating Spectral Emission Shaping Sigma Delta Modulator" incorporated herein by reference in its entirety.

FIELD OF THE INVENTION

The present invention relates to the field of data communications and more particularly relates to a sigma delta amplitude modulator having a noise transfer function adapted to shift quantization noise outside at least one frequency band of interest.

BACKGROUND OF THE INVENTION

Digital RF Processor or Digital Radio Processor (DRP™) based transceivers are also known in the art. The performance of DRP based transmitters is typically limited by the quantization noise of the digital power amplifier (DPA). DPA architectures employing large bit widths, e.g., 10, 12 or more bits, incorporating many hundreds of transistors become unfeasible due to the level of quantization noise generated. The quantization noise generated is sufficient to cause the transmitter to fail to meet the specifications of cellular or other communications standards, depending on the particular application.

Sigma delta or delta sigma modulators are known in the art. Digital sigma delta modulators are currently used in CMOS wireless SoC designs to achieve high resolution data conversion while controlling the quantization noise spectrum. Conventional sigma delta modulators typically have a high pass transfer function. In other words, they amplify the noise (or push the noise into higher frequencies) as the frequency difference from the carrier frequency increases. In DRP applications, this characteristic is undesirable. In fact, the opposite is desired in certain frequency bands wherein noise is attenuated as the frequency increases from the center frequency.

Further, conventional sigma delta modulator structures designed to achieve such noise shaping are hardware intensive, are not designed to exhibit an arbitrary noise transfer function and typically do not meet the requirements of communication standards such as typical cellular standards.

Thus, there is a need for a technique for synthesizing a sigma delta modulator to have an arbitrary noise transfer function whereby quantization noise can be shifted from one frequency band to another. There is a further need for a DRP transmitter incorporating a spectral emission shaping sigma delta modulator that is able to shape the quantization noise of the transmitter so as to avoid certain frequency bands.

SUMMARY OF THE INVENTION

The present invention provides a solution to the problems of the prior art by providing a novel and useful sigma delta amplitude modulator having a noise transfer function adapted to shift quantization noise outside at least one frequency band of interest. Several embodiments of the sigma delta amplitude modulator are described including a programmable order low pass stage and a modulator incorporating comb filtering wherein each comb filter comprises a plurality of fingers that permit greater programmability in the frequency location of notches.

A polar transmitter incorporating the sigma delta modulator of the present invention is also described. A transmitter employing polar transmit modulation is presented that shapes the spectral emissions of the digitally-controlled power amplifier such that they are significantly and sufficiently attenuated in one or more desired frequency bands.

In the case of a polar transmitter, the present invention is operative to shape the quantization noise through sigma delta modulation of the amplitude (i.e. the magnitude) so as to avoid one or more restricted bands wherein transmission noise must be kept below a specified level. Note that the noise is not necessarily made flat but rather noise is increased in certain places and reduced other in order to meet cellular or other communication standards requirements. Thus, the invention does not eliminate quantization noise but rather shifts it out of some bands and into others in accordance with the particular communication standard.

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is therefore provided in accordance with the invention, a sigma delta amplitude modulator comprising a first input for receiving an amplitude information signal as an integer portion signal and a fractional portion signal, a transistor array coupled to the integer portion signal of the first input and comprising a plurality of transistors adapted to generate an output signal whose amplitude is substantially proportional to the number of transistors active at any one time in the array, a sigma delta modulator having an associated noise transfer function and coupled to the fractional portion signal of the first input, the sigma delta modulator comprising one or more concatenated first order sigma delta stages, a combiner for combining the output of each of the one or more concatenated first order sigma delta stages to yield an output therefrom and means for combining the output of the transistor array and the sigma delta modulator to generate a dithered amplitude signal therefrom and to selectively attenuate a noise transfer function at one or more selected frequencies.

There is also provided in accordance with the invention, a sigma delta amplitude modulator comprising a first input for receiving an amplitude information signal as an integer portion signal and a fractional portion signal, a first comb filter comprising a first plurality of fingers coupled to the integer portion signal of the first input, a plurality of transistor arrays, each the transistor array coupled to the output of one of the fingers of the first comb filter and comprising a plurality of transistors adapted to generate an output signal whose amplitude is substantially proportional to the number of transistors active at any one time in the array, a sigma delta modulator having an associated noise transfer function and coupled to the fractional portion signal of the first input, the sigma delta modulator comprising one or more concatenated first order sigma delta stages, a combiner for combining the output of each of the one or more concatenated first order sigma delta stages to yield an output therefrom, a second comb filter comprising a second plurality of fingers coupled to the output of the sigma delta modulator and means for combining the output of the first comb filter and the second comb filter to generate a dithered amplitude signal therefrom wherein a noise transfer function is selectively attenuated at one or more selected frequencies.

There is further provided in accordance with the invention, a radio frequency (RF) polar transmitter comprising a first digital input for receiving an amplitude control word signal, a second digital input for receiving a frequency control word signal, a frequency synthesizer coupled to the second digital input and operative to generate a phase modulated carrier signal in accordance with the frequency control word signal, a sigma delta modulator having an associated noise transfer function and coupled to the first digital input, the sigma delta modulator comprising a first input for receiving the amplitude control word as an integer portion signal and a fractional portion signal, a first comb filter comprising a first plurality of fingers coupled to the integer portion signal of the first input, a plurality of transistor arrays, each the transistor array coupled to the output of one the fingers of the first comb filter and comprising a plurality of transistors adapted to generate an output signal whose amplitude is substantially proportional to the number of transistors active at any one time in the array, a sigma delta modulator having an associated noise transfer function and coupled to the fractional portion signal of the first input, the sigma delta modulator comprising one or more concatenated first order sigma delta stages, a combiner for combining the output of each of the one or more concatenated first order sigma delta stages to yield an output therefrom, a second comb filter comprising a second plurality of fingers coupled to the output of the sigma delta modulator, means for combining the output of the first comb filter and the second comb filter to generate a dithered amplitude signal therefrom wherein a noise transfer function is selectively attenuated at one or more selected frequencies, a digitally controlled amplifier comprising a plurality of discrete levels of amplitude and coupled to the frequency synthesizer and the sigma delta modulator, the amplifier operative to control the amplitude of the phase modulated carrier signal in accordance with the dithered amplitude control signal and wherein quantization noise exhibited by the amplifier is significantly attenuated at one or more selected frequencies.

There is also provided in accordance with the invention, a polar transmitter comprising a first input for receiving an amplitude information signal as an integer portion signal and a fractional portion signal, a second input for receiving an angle information signal, a frequency synthesizer coupled to the second input and operative to generate an angle modulated carrier signal in accordance with the angle information signal, a sigma delta modulator having an associated noise transfer function, the sigma delta modulator coupled to the first input and operative to generate a dithered amplitude signal therefrom and to encode data such that quantization noise exhibited by an amplifier is distributed outside at least one frequency band of interest, the sigma delta modulator comprising a programmable order low pass sigma delta stage, one or more comb filters, each comb filter comprising a plurality of fingers, a combiner operative to combine the output of the programmable order low pass sigma delta stage and the one or more comb filters, the amplifier comprising a plurality of discrete levels of amplitude and adapted to receive the output of the frequency synthesizer and the sigma delta modulator, the amplifier operative to control the amplitude of the angle modulated carrier signal in accordance with the output of the sigma delta modulator.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
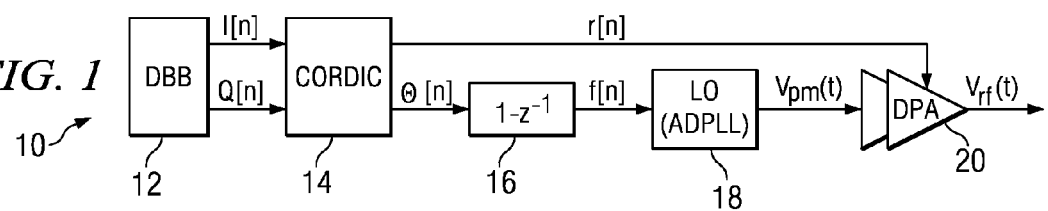
FIG. 1 is a block diagram illustrating an example of an all-digital polar modulator architecture.

The following notation is used throughout this document.

| Term | Definition |
| --- | --- |
| ACW | Amplitude Control Word |
| ADC | Analog to Digital Converter |
| ADPLL | All Digital Phase Locked Loop |
| ASIC | Application Specific Integrated Circuit |
| AWG | Augmented Wiener Hopf |
| BIBO | Bounded Input/Bounded Output |
| BPSK | Binary Phase Shift Keying |
| CMOS | Complementary Metal Oxide Semiconductor |
| CORDIC | Coordinate Rotation Digital Computer |
| DAC | Digital to Analog Converter |
| DBB | Digital Baseband |
| DC | Direct Current |
| DCO | Digitally Controlled Oscillator |
| DCS | Digital Cellular System |
| DD | Decision Directed |
| DFE | Decision Feedback Equalizer |
| DNL | Differential Nonlinearity |
| DPA | Digital Power Amplifier |
| DRP | Digital RF Processor or Digital Radio Processor |
| DSB | Double Side Band |
| DSP | Digital Signal Processor |
| EDGE | Enhanced Data rates for Global Evolution |
| EVM | Error Vector Magnitude |
| FCW | Frequency Control Word |
| FFE | Feed Forward Equalizer |
| FFT | Fast Fourier Transform |
| FM | Frequency Modulation |
| FPGA | Field Programmable Gate Array |
| GSM | Global System for Mobile Communication |
| HDL | Hardware Description Language |
| IIR | Infinite Impulse Response |
| INL | Integral Nonlinearity |
| LAN | Local Area Network |
| LO | Local Oscillator |
| LPF | Low Pass Filter |
| LTI | Linear Time Invariant |
| MSE | Mean Squared Error |
| NP | Noise Predictor |
| NTF | Noise Transfer Function |
| PA | Power Amplifier |
| PLL | Phase Locked Loop |
| PPA | Pre-Power Amplifier |
| PSD | Power Spectral Density |
| RF | Radio Frequency |
| RLS | Recursive Least Square |
| SAM | Sigma-delta Amplitude Modulation |
| SAW | Surface Acoustic Wave |
| SD | Sigma Delta |
| SNR | Signal to Noise Ratio |
| SoC | System on Chip |
| SSB | Single Side Band |
| STF | Signal Transfer Function |
| TNG | Total Noise Gain |
| UWB | Ultra Wideband |
| VCO | Voltage Controlled Oscillator |
| WCDMA | Wideband Code Division Multiple Access |
| WLAN | Wireless Local Area Network |

DETAILED DESCRIPTION OF THE INVENTION

The present invention provides a solution to the problems of the prior art by providing a novel and useful sigma delta modulator having a noise transfer function adapted to shift quantization noise outside at least one frequency band of interest. Several embodiments of the sigma delta amplitude modulator are described including a programmable order low pass stage and a modulator incorporating comb filtering wherein each comb filter comprises a plurality of fingers that permit greater programmability in the frequency location of notches. A polar transmitter incorporating the sigma delta modulator of the present invention is also presented.

The sigma delta modulator circuit architecture can be used in a polar modulator in an ADPLL within a digital radio processor. To aid in understanding the principles of the present invention, the description of the spectral emission shaping sigma delta modulator is provided, in one example embodiment, in the context of an all digital PLL (ADPLL) based RF transmitter. An ADPLL suitable for use in the present invention is described in more detail in U.S. Pat. Nos. 6,791,422 and 6,809,598 and U.S. application Ser. No. 11/203,019, filed Aug. 11, 2005, entitled "Hybrid Polar/Cartesian Digital Modulator", all of which are incorporated herein by reference in their entirety.

The sigma delta modulator of the present invention is intended for use in a radio transmitter and transceiver but can be used in other applications as well. It is appreciated by one skilled in the art that the spectral emission shaping sigma delta modulator scheme of the present invention is not limited for use with any particular communication standard (wireless or otherwise) can be adapted for use with numerous wireless (or wired) communications standards such as EDGE, extended data rate Bluetooth, WCDMA, Wireless LAN (WLAN), Ultra Wideband (UWB), coaxial cable, radar, optical, etc. Further, the invention is not limited for use with a specific modulation scheme but is applicable to other complex amplitude modulation schemes as well.

Note that throughout this document, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. In addition, the terms sigma delta ($\Sigma\Delta$) and delta sigma ($\Delta\Sigma$) are used interchangeably.

Polar Modulation

Delta Sigma ($\Delta\Sigma$) modulators have become a common basic building block in the design of electronic systems. Techniques are available to design sigma delta modulators given any properly normalized noise transfer function. The resultant controllers satisfy a few requirements including real coefficients, causality and Bounded Input/Bounded Output (BIBO) stability. While the common $\Delta\Sigma$ modulator used in analog-to-digital converters (ADCs) or digital-to-analog converters (DACs) has a typical high-pass noise shape, which assumes analog or digital filtering to filter out the unwanted noise in the high frequency areas, the technique of the present invention allows the designer to shape the noise into any shape or even make the noise shape software programmable.

FIG. 1 shows a polar modulator based all-digital transmitter, generally referenced 10, constructed in accordance with the present invention. The transmitter comprises a digital baseband 12, Cartesian to polar converter (CORDIC) 14, differentiator 16, ADPLL 18 and digital power amplifier 20. The I/Q signal is first converted into polar representation using a Cartesian to polar transformation (e.g., CORDIC). The instantaneous frequency signal f[n] is derived from the angle information by:

$$f[n] = \frac{1}{2\pi} \frac{\theta[n] - \theta[n-1]}{\Delta t} \quad (1)$$

where $\Delta t$ is the sampling period. This signal is then fed into an all-digital phased-locked loop (ADPLL) acting as a phase modulator (PM), with a carrier frequency $f_c$. The output of the ADPLL is a constant envelope signal having a complex envelope of $\exp(j\theta[n])$. The ADPLL output voltage is given by $$v_{pm}(t) = \cos\left\{2\pi\left(f_n t + \sum_{k=0}^{\lfloor t/f_s\rfloor} f[k]T_s\right)\right\} \quad (2)$$

Where $f_n$ is the ADPLL natural frequency, $f_s=1/T_s$ is the sampling frequency and f[k] is the instantaneous frequency at sampling instance k. Equation (2) reveals that the ADPLL is analogous to a VCO but works in the discrete and digital domain. One implementation of the ADPLL employs a digitally-controlled oscillator (DCO), which translates a digital frequency control word (FCW) into an analog frequency using a bank of switched varactors. A more detailed description of the ADPLL can be found in U.S. application Ser. No. 11/203,019, cited supra.

The output of this device is fed into a power amplifier with a voltage controlled power. The power control is fed by r[n] and the output voltage is given by:

$$v_{rf}(t) = r[n]|_{n=\lfloor t/f_s\rfloor} v_{pm}(t) \quad (3)$$

where $v_{rf}(t)$ is the RF output voltage of the voltage controlled power amplifier.

An advantage of this method is that it maintains the efficiency of its analog counterpart, while the modulating signals are kept digital and so are most of the ADPLL circuits. This offers a clear migration path with process scaling and other advantages such as easy design for testing.

Figure 2:
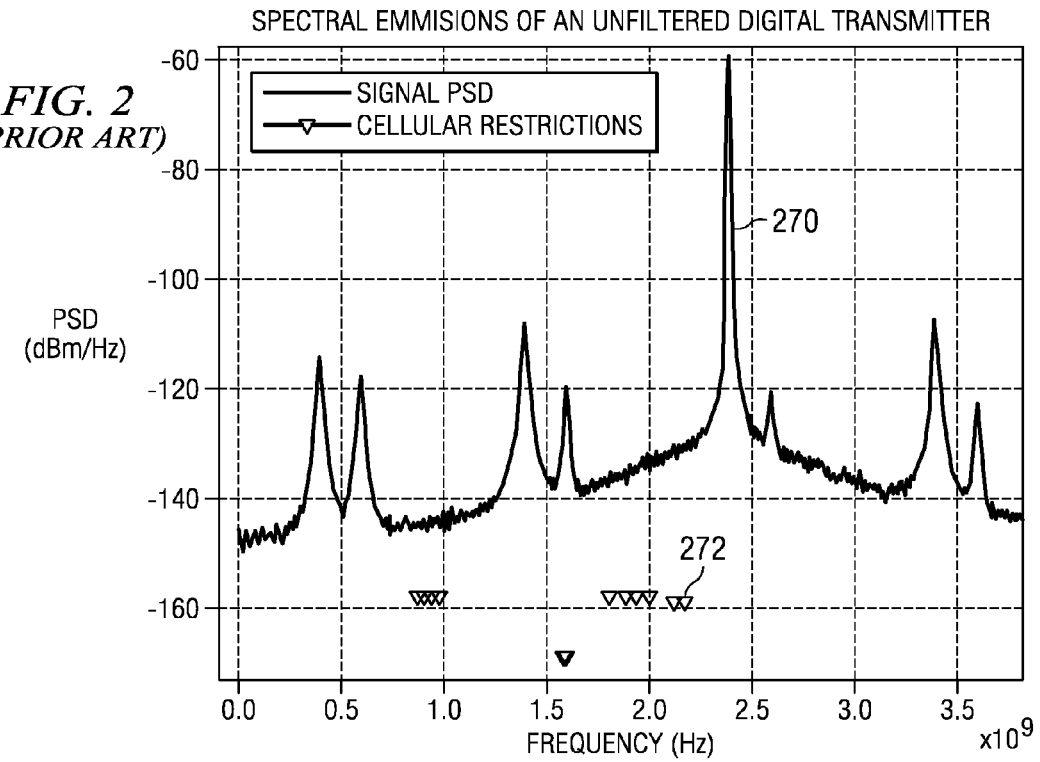
FIG. 2 is a diagram illustrating the spectral emissions from an unfiltered WLAN digital transmitter.

A drawback of this technique is that the DPA, having a finite set of amplitudes, generates quantization noise that fills up the spectrum, possibly causing unwanted disturbance. Furthermore, the digital discrete time nature of the DPA amplitude changes causes frequency replicas, similar to the spectrum of a sampled signal. FIG. 2 shows a typical spectrum of a DPA output. Here, the modulating signal was a WLAN 802.11g signal (20 MHz bandwidth), centered at $f_c$=2.4 GHz. The black 272 trace shows a typical set of cellular forbidden bands. Since filtering the output signal is problematic in terms of area and power, we would like a means to control the emission spectrum in a way where the designer could divert the noise from the undesired (forbidden) bands into other, less restrictive bands.

Sigma Delta Amplitude Modulation—System Analysis

With reference to FIG. 1, the polar transmitter suitable for use in a complex modulation Digital Radio Platform is operative to receive digital data from the DSP or other host (not shown), perform pulse shaping on the I/Q data and convert it to amplitude and phase information via the CORDIC. The amplitude and phase information each is processed for rate up-conversion (interpolation). Phase information is passed to the ADPLL as a frequency control word (FCW) which functions to modulate it on the carrier frequency. Amplitude information is passed through a sigma delta amplitude modulation (SAM) block to place the digital data in a form that the DPA can handle (i.e. substantially thermometer encoded), while providing resolution enhancements through sigma delta dithering. The DPA converts the digital amplitude data into an analog envelope on top of the FM modulated carrier presented at its input. The final RF output comprises the complex modulated carrier constructed in polar coordinates.

The DPA is described in more detail in U.S. application Ser. No. 11/115,815, filed Apr. 26, 2005, entitled "Low Noise High Isolation Transmit Buffer Gain Control Mechanism," incorporated herein by reference in its entirety. In the DPA, digital control bits represent amplitude data bits which are applied to a transistor array. Depending on the status of an amplitude bit, a corresponding transistor turns ON or OFF. The output power is proportional to the summation of the current output of each transistor turned ON. The current output of a certain transistor is proportional to the size of that transistor. Thus, the DPA can be constructed in one of the following three ways:

1. A thermometer coded DAC, i.e. a 10-bit DAC corresponding to 1024 same sized transistors. A drawback is that the high number of transistors makes routing and layout challenging.
2. A binary coded DAC, i.e. a 10-bit DAC corresponding to 10 transistors having different sizes depending on the bit location in the amplitude control word. The drawback with this approach is the mismatch that would be suffered in a practical on-chip implementation. For example, if a transistor is twice as big as an adjacent transistor, the output current is not exactly twice as much. This problem typically results in high Differential Non-Linearity (DNL) in the DAC. Furthermore, due to geometric inaccuracies and other sources of mismatch related with practical fabrication, a doubly sized transistor may not be exactly double in size in reality, thus resulting in a deviation from the nominal intended binary weighting.
3. A hybrid structure, which is a compromise between the above two structures. In this structure, a 10-bit DAC is implemented using 256 thermometer weighted (i.e. same size) transistors that yield a resolution of 8-bits and three ¼ sized transistors that provide an extra 2-bits of resolution. This structure suffers somewhat from the disadvantages of the previous two structures, but it provides results better than either one.

EDGE Frequency Emission Mask

For complex modulation standards, such as EDGE, the DAC in the DPA has high resolution to accommodate the spectral mask and the far out noise floor specifications. Alternatively, a SAW filter may be used at the output of the digital PPA to suppress far-out spurious emissions and noise. Table 6 presents the GSM/EDGE frequency bands.

TABLE 6

GSM/EDGE frequency bands

| | | | TX | | | RX | |
|---|---|---|---|---|---|---|---|
| | | | Start MHz | End MHz | Separation MHz | Start MHz | End MHz |
| LB | GSM-850 | | 824 | 849 | | 869 | 894 |
| | | Span | 25 | | 20 | 25 | |
| | E-GSM | | 880 | 915 | | 925 | 960 |
| | | Span | 35 | | 10 | 35 | |
| HB | DCS-1800 | | 1710 | 1785 | | 1805 | 1880 |
| | | Span | 75 | | 20 | 75 | |
| | PCS-1900 | | 1850 | 1910 | | 1930 | 1990 |
| | | Span | 60 | | 20 | 60 | |

When the transmitter is on, the noise added to the receive band is preferably below −158 dBc/Hz for low band operation and −152 dBc/Hz for high band operation. The following shows the maximum and minimum frequency separation between different transmit channels and the receive bands.

Figure 3:
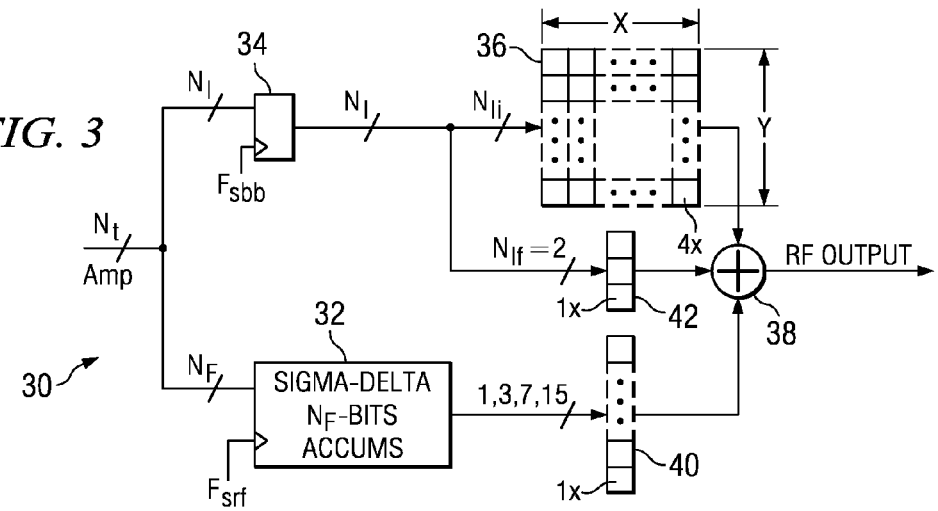
FIG. 3 is a block diagram illustrating a $\Sigma\Delta$ amplitude modulation (SAM) block.

(1) GSM-850:
  a. TX channel is at 824 MHz (lowest frequency in the band)
    i. RX band starts 45 MHz away
    ii. RX band ends 70 MHz away
  b. TX channel is at 849 MHz (highest frequency in the band)
    i. RX band starts 20 MHz away
    ii. RX band ends 45 MHz away
(2) E-GSM:
  a. TX channel is at 880 MHz (lowest frequency in the band)
    i. RX band starts 45 MHz away
    ii. RX band ends 80 MHz away
  b. TX channel is at 915 MHz (highest frequency in the band)
    i. RX band starts 10 MHz away (relaxed noise-level requirements)
    ii. RX band ends 45 MHz away
(3) D C S1800:
  a. TX channel is at 1710 MHz (lowest frequency in the band)
    i. RX band starts 95 MHz away
    ii. RX band ends 170 MHz away
  b. TX channel is at 1785 MHz (highest frequency in the band)
    i. RX band starts 20 MHz away
    ii. RX band ends 95 MHz away
(4) PCS-1900:
  a. TX channel is at 1850 MHz (lowest frequency in the band)
    i. RX band starts 80 MHz away
    ii. RX band ends 140 MHz away
  b. TX channel is at 1910 MHz (highest frequency in the band)
    i. RX band starts 20 MHz away
    ii. RX band ends 80 MHz away Sigma Delta Amplitude Modulation (SAM) Block A 10-bit DAC cannot realize all the requirements and specifications for EDGE transmission, if an analog filtering is not used, i.e. no SAW filter at the output of the PPA. To be able to achieve the higher resolution needed, thus eliminating the need for the analog filtering, a sigma delta modulator is added. FIG. 3 shows a block diagram of the SAM block, wherein the sigma delta dithering is realized. The SAM, generally referenced 30, comprises register 34, matrix arrays 36, 40, 42, $\Sigma\Delta$ modulator 32 and summer 38.

The input amplitude signal is represented by $N_t$ number of bits which are split into an integer part having $N_i$ bits and a fractional part having $N_f$ bits. $N_i$ splits into $N_{1i}$ and $N_{1f}$. $N_{1f}$ is always 2, since it is fed to a 1× sized device. On the other hand, $N_{1i}$ depends on particular routing and layout of the PPA transistors. In a preferred embodiment, $N_{1i}$ is 8-bits, which translates to 256 transistors arranged in an array with X=32 columns and Y=8 rows.

The integer part is output to the PPA at the Nyquist sampling frequency, $Fs_{bb}$. The fractional part is typically output at the RF sampling frequency $Fs_{rf}$ after passing through the $\Sigma\Delta$ modulator. The effective amplitude resolution is equivalent to $N_t = N_i + N_f$ bits. Note that the SAM uses a hybrid PPA design.

To analyze the $\Sigma\Delta$ amplitude modulation (SAM) block three main components of the output spectrum need to be analyzed:

1. The noise shaping from the fractional low-pass sigma delta portion of the SAM.
2. The Nyquist quantization noise over the baseband sampling spectrum.
3. The zero-order hold effect due to the oversampling from the baseband sampling frequency $Fs_{bb}$ to the RF sampling frequency $Fs_{rf}$.

Component 1

Let the step size in the 1-bit quantizer $$\Delta = \left(\frac{2V}{2^N - 1}\right),$$

where the number of bits N=1, the amplitude signal peak V=1. Thus $\Delta = 2$ and the quantization noise variance $$\sigma_e^2 = \frac{\Delta^2}{12}.$$

A quantized signal sampled at frequency $F_S$ has all of its quantization noise power folded into the frequency band of $$0 \leq f \leq \frac{F_S}{2}.$$

Assuming that the noise is random, the spectral density of the noise is given by $E(f) = \sigma_e \sqrt{2T_S}$.

For a low pass first order $\Sigma\Delta$ modulator the noise is shaped by the transfer function $H(z) = (1 - Z^{-1})$. Converting the z-domain transfer function to the frequency domain yields:

$$H(\omega) = (1 - e^{(-j\omega T_S)}) \quad (4)$$

Therefore $$|H(\omega)| = |1 - e^{-j\omega T_S}| = \left|e^{-j\omega\frac{T_S}{2}}\right|\left|e^{j\omega\frac{T_S}{2}} - e^{-j\omega\frac{T_S}{2}}\right| = 2\sin\left(\frac{\omega T_S}{2}\right) \quad (5)$$

Combining the transfer function with the quantization noise spectral density, the first order sigma delta modulator noise spectral density is defined as:

$$|N(f)| = 2\sigma_e \sqrt{2T_{Srf}} \, \text{Sin}\left(\frac{\omega T_{Srf}}{2}\right) \quad (6)$$

where $T_{Srf}$ denotes the period of the sampling clock $= \frac{1}{Fs_{rf}}$, $$\omega = 2\pi f.$$

For higher order $\Sigma\Delta$ modulators, the spectral density function of the modulator noise is given by:

$$|N(f)| = \sigma_e \sqrt{2T_{Srf}} \left[2\text{Sin}\left(\frac{\omega T_{Srf}}{2}\right)\right]^L \quad (7)$$

where L denotes the order of the $\Sigma\Delta$ modulator order.

The total dynamic range for the input amplitude signal to the SAM block is $6 \cdot (N_i + N_f)$ dB. Thus, $|N(f)|$ is shifted by the integer part having a dynamic range of $6 \cdot N_i$ dB and 3 dB is subtracted due to the conversion from DSB to SSB. The final power spectral density of the fractional part is given by:

$$P_{SD}(f)_{dBc/Hz} = 20\text{Log}_{10}(|N(f)|) - 6 \cdot N_i - 3 \quad (8)$$

$$P_{SD}(f)_{dBc/Hz} = 20\text{Log}_{10}\left|\sigma_e \sqrt{2T_{Srf}}\left[2\text{Sin}\left(\frac{\omega T_{Srf}}{2}\right)\right]^L\right| - 6 \cdot N_i - 3 \quad (9)$$

Component 2

The power spectral density of the Nyquist quantization noise of the input amplitude signal sampled using a clock running at frequency $Fs_{bb}$ is given by:

$$P_{Nyq}(f)_{dBc/Hz} = -6 \cdot (N_i + N_f) - 10\text{Log}_{10}\left(\frac{Fs_{bb}}{2}\right) - 3 + S_x \quad (10)$$

where the 3 dB subtracted is due to the conversion from DSB to SSB. If the signal is normalized, meaning $$s_n(t) = \frac{s(t)}{\left(\sqrt{2} \cdot STD(s(t))\right)} \quad (11)$$

where STD(x) is the standard deviation of x, then $S_x = -3$ dB.

Component 3

The zero-order hold resulting from the over sampling of the amplitude signal from $Fs_{bb}$ to $Fs_{rf}$ can be considered as a cascade of impulse sampling with a zero-order hold rectangular filter, i.e. a filter with impulse response of:

$$h(t) = \Pi\left(\frac{\left(t - \frac{T_{sbb}}{2}\right)}{T_{sbb}}\right) \quad (12)$$

where $\Pi(t)$ is the rectangular pulse waveform.

Figure 4:
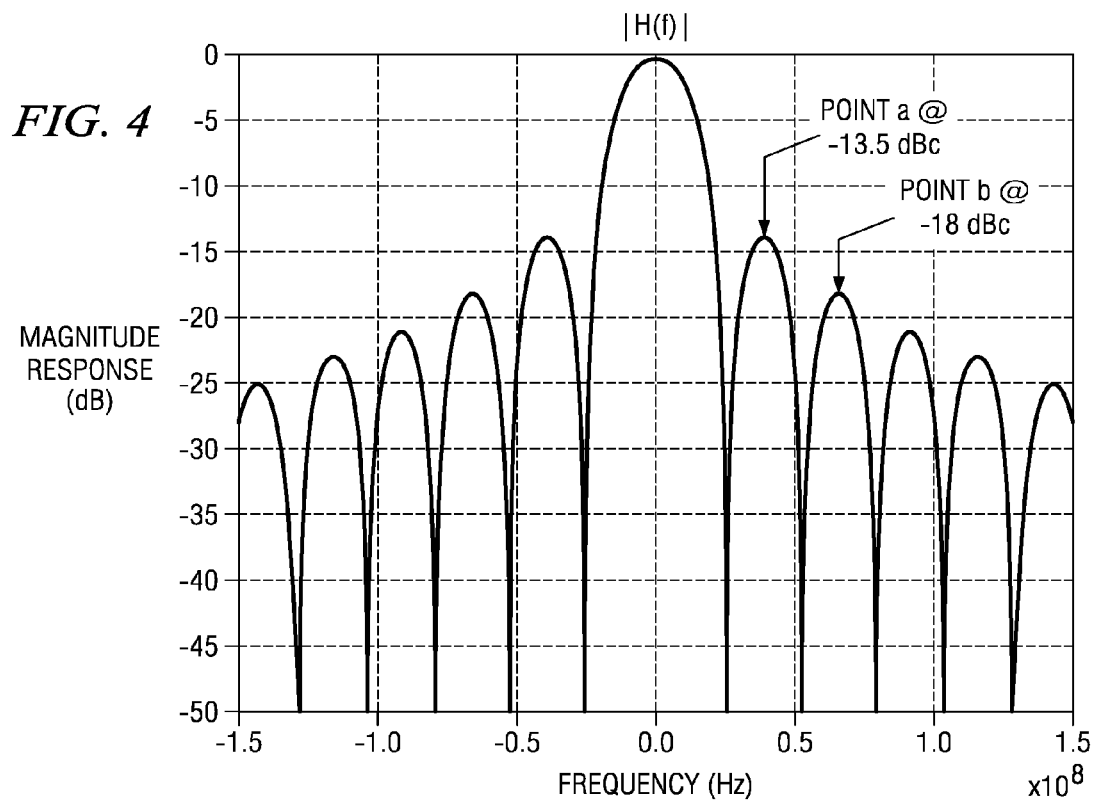
FIG. 4 is a plot illustrating the magnitude response of the zero-order hold filter at $F_{sbb}$=26 MHz.

The frequency response of this filter is given by:

$$H(f) = T_{sbb} e^{-j\pi T_{sbb} f} \frac{\text{Sin}(T_{sbb} \pi f)}{(T_{sbb} \pi f)} \quad (13)$$

where zero crossings occur at $f = nF_{sbb}$, $n = 1, 2, 3, \ldots$ The filter magnitude response $|H(f)|$ is shown in FIG. 4. Point (a) is at $f = 1.5 \cdot F_{sbb}$, resulting in $$|H(f)| = \frac{\text{Sin}(1.5 \cdot \pi)}{(1.5 \cdot \pi)} = -13.5 dBc.$$

Point (b) is at $f = 2.5 \cdot F_{sbb}$, resulting in $|H(f)| = -17.9$ dBc.

Considering x(t) to be the sampled amplitude signal, the impulse-sampled version of x(t) can be written in the frequency domain as follows:

$$X_p(f) = \sum_{n=-\infty}^{+\infty} X(f - nF_{sbb}) \quad (14)$$

By passing this signal through the zero order hold, the output becomes:

$$X_{ZOH}(f) = \sum_{n=-\infty}^{+\infty} e^{-j\pi f T_{sbb}} \frac{\text{Sin}(\pi f T_{sbb})}{(\pi f T_{sbb})} X(f - nF_{sbb}) \quad (15)$$

Using (15) and (10), the noise spectral density for the input signal with $N_r = (N_i + N_f)$ number of bits oversampled from $Fs_{bb}$ to $Fs_{rf}$ is given by:

$$P_{Nyq(dBc/Hz)}(f) = \quad (16)$$

$$-6 \cdot (N_i + N_f) - 10\text{Log}_{10}\left(\frac{Fs_{bb}}{2}\right) - 3 + S_x + 20\text{Log}_{10}\left(\left|\frac{\text{Sin}(\pi f T_{sbb})}{(\pi f T_{sbb})}\right|\right)$$

Figure 5:
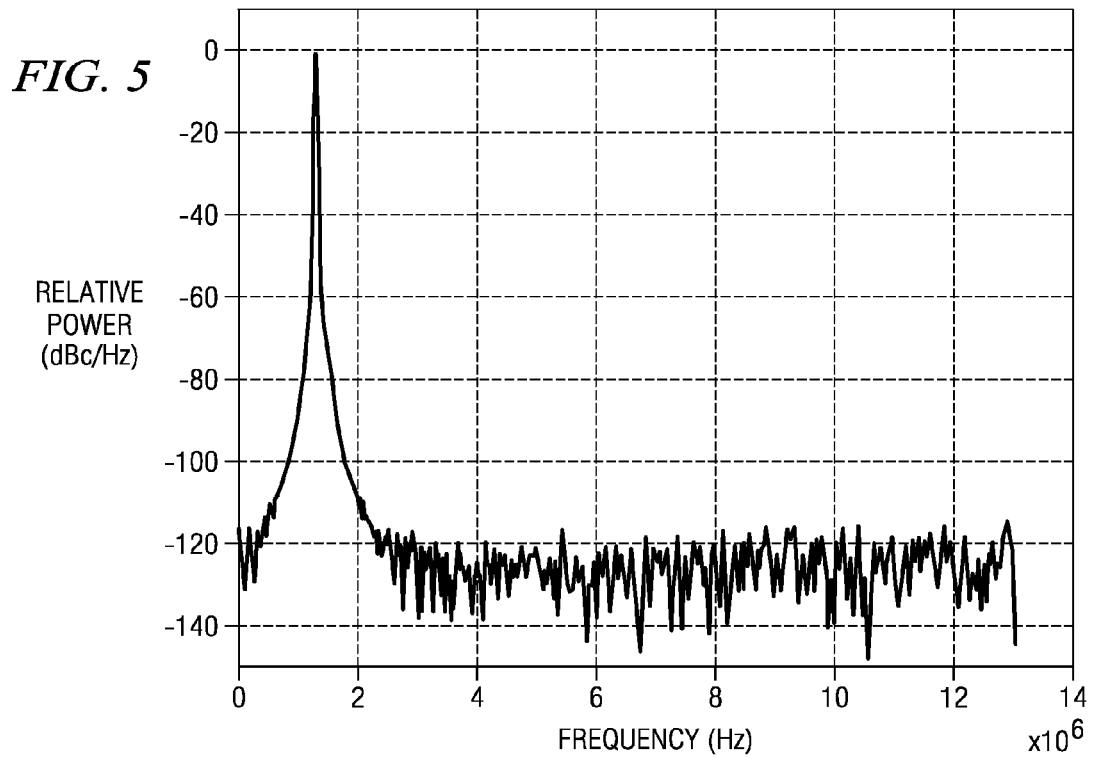
FIG. 5 is a plot illustrating the relative power of a 16-bit sine wave having frequency of 1.33 MHz and $F_S$=26 MHz.
Figure 6:
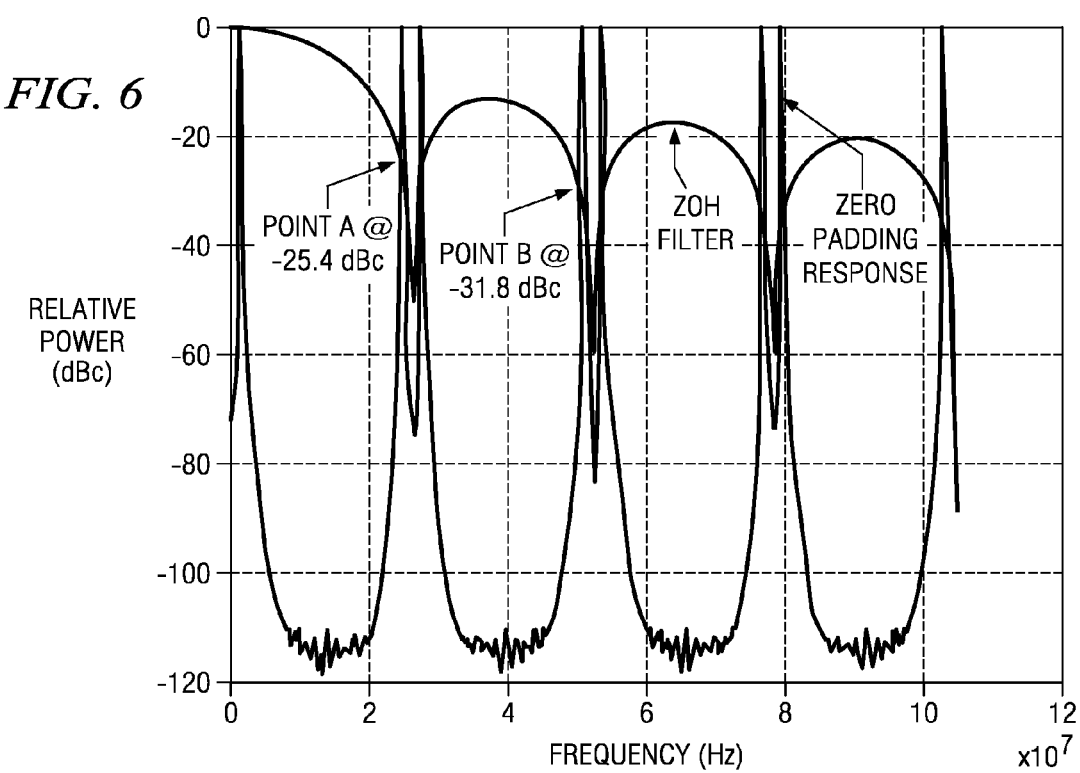
FIG. 6 is a plot illustrating the impulse response of the sine wave superimposed on the magnitude response of the zero-order hold filter response.
Figure 7:
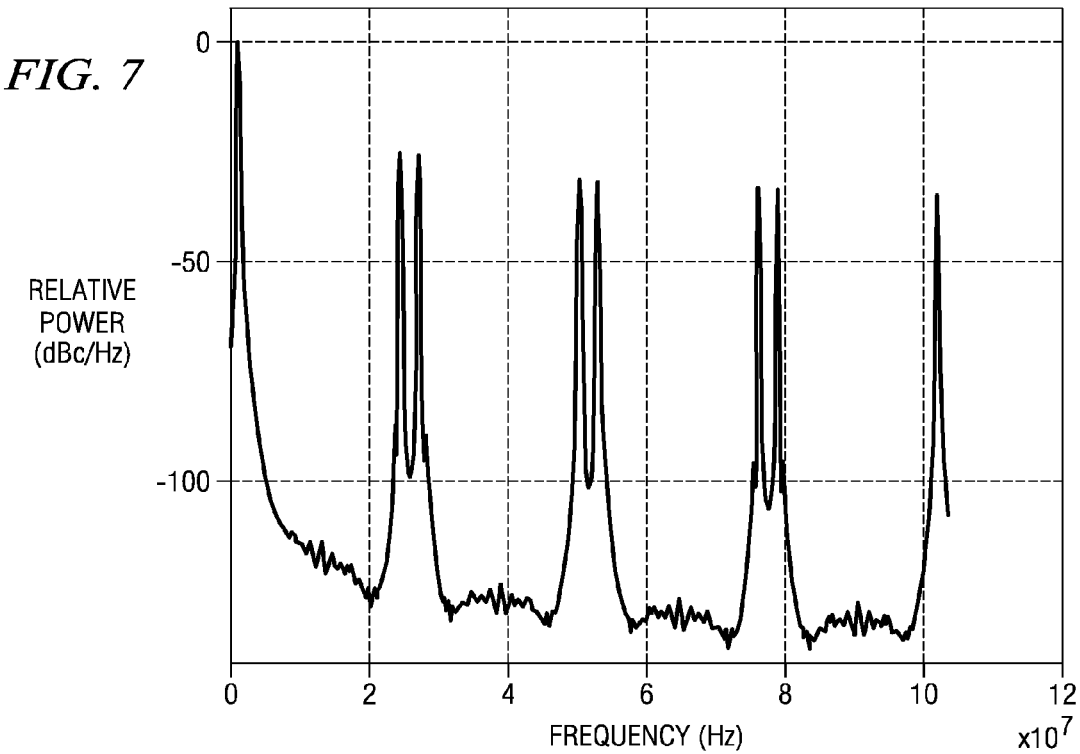
FIG. 7 is a plot illustrating the magnitude response of the over-sampled sine wave using a zero-order hold filter.

For example, consider x(t), a 16-bit sine wave having a frequency of 1.33 MHz with a sampling frequency of 26 MHz, as shown in FIG. 5. The signal is up-sampled by 8 to 208 MHz by passing the impulse-sampled version of x(t) through the zero-order hold filter as shown in FIG. 6. The output will be as shown in FIG. 7, which reflects the magnitude of Equation (16).

Point A in FIG. 6, which is the sampling frequency image located at $f = F_{sbb} - F_0$, can be calculated as follows: $Fs_{bb} = 26$ MHz, $F_0 = 1.33$ MHz, $X(f)_{impulse} = 0$ dB. Therefore, $$20\text{Log}_{10}(X(f)_{zoh@A}) = 20\text{Log}_{10}\left(\left|\frac{\text{Sin}(\pi(F_{sbb} - F_0)/F_{sbb})}{(\pi(F_{sbb} - F_0)/F_{sbb})}\right|\right) \quad (17)$$

$$= 20\text{Log}_{10}\left(\left|\frac{\text{Sin}(\pi(26e^6 - 1.33e^6)/26e^6)}{(\pi(26e^6 - 1.33e^6)/26e^6)}\right|\right)$$

$$= -25.4 \, dB$$

Figure 8:
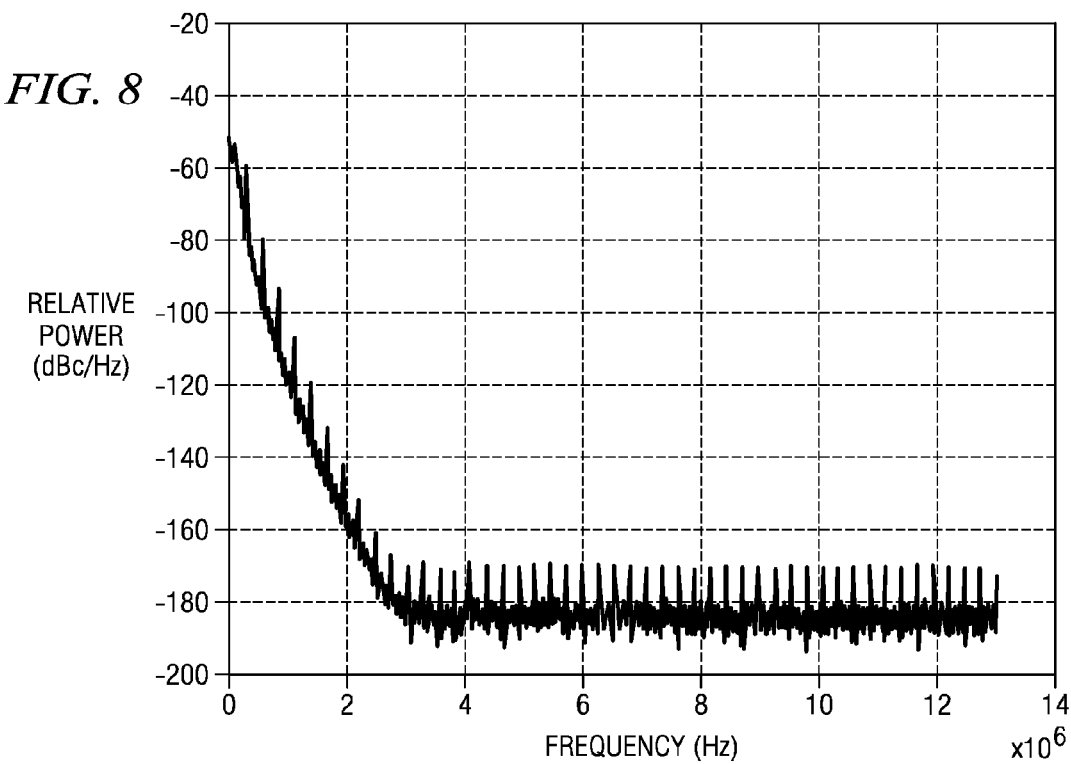
FIG. 8 is a plot illustrating the amplitude spectrum of a 16-bit EDGE signal sampled at 26 MHz.
Figure 10:
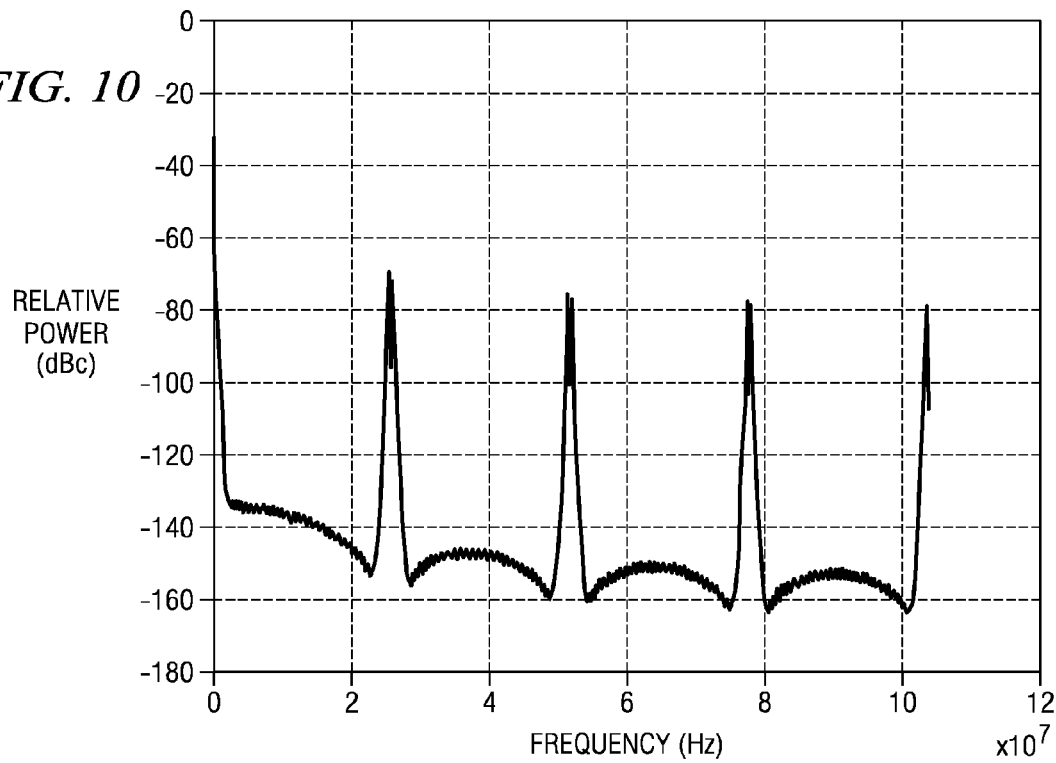
FIG. 10 is a plot illustrating the zero-order hold over-sampled EDGE amplitude signal sampled at 26 MHz.
Figure 9A:
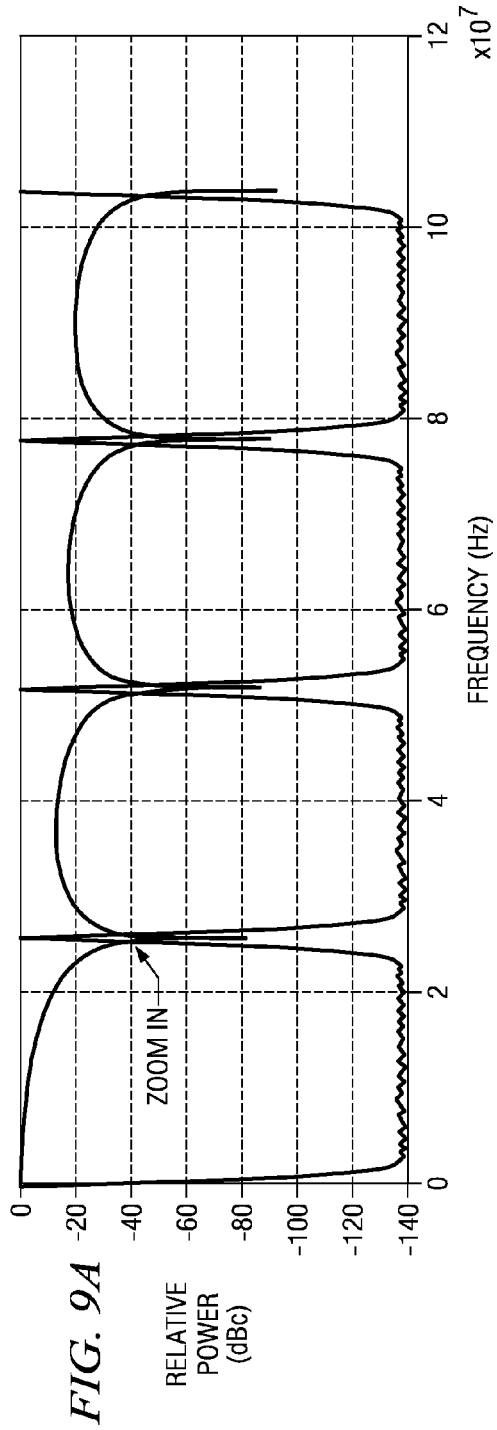
FIGS. 9A and 9B are plots of the spectrum of the zero-order hold filter versus the EDGE amplitude signal over-sampled by eight.
Figure 9B:
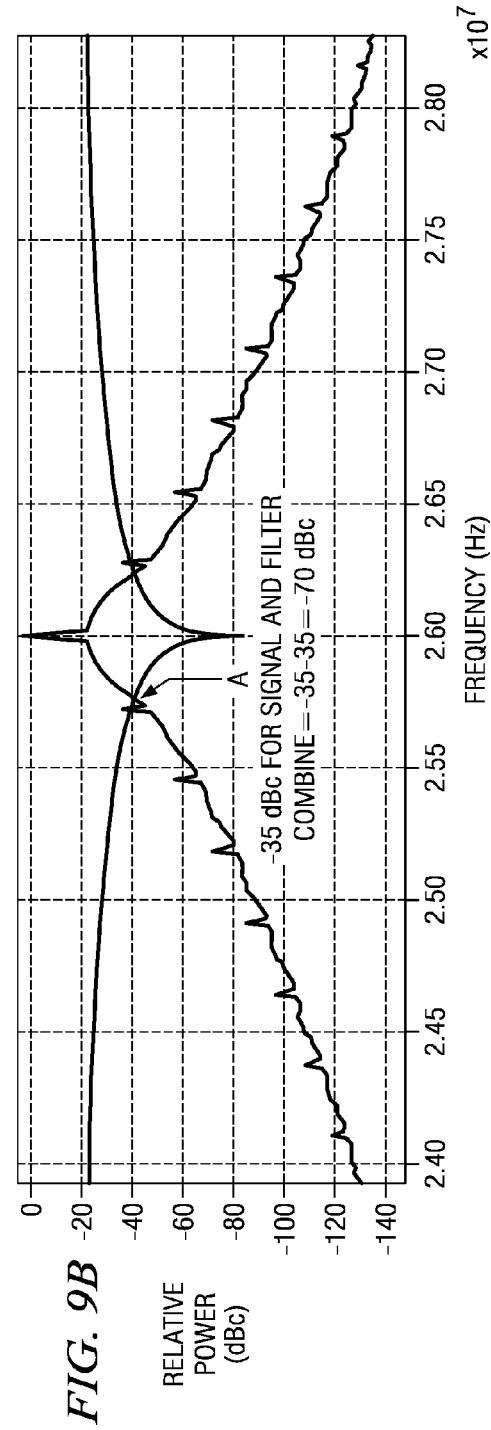

The same can be done for an EDGE amplitude signal. FIG. 8 shows the spectrum for a 16-bit EDGE amplitude signal sampled at 26 MHz. FIGS. 9A and 9B show (1) the spectrum of the impulse-sampled EDGE envelope signal after oversampling by eight by zero padding every sample, and (2) the spectrum for the output signal of the zero-order hold filter. FIG. 10 shows the end result for the zero-order hold oversampled EDGE amplitude signal.

At point A in FIG. 9A, where the zero-order filter intersects with the first spectral replica of the spectrum of the sampled amplitude, the peak of the replica is at −35−35=−70 dBc.

Implementation of a MASH Low Pass ΣΔ Modulator

In this section the structure of a programmable order MASH sigma delta used in the SAM block of the present invention is presented.

$1^{st}$ Order Low Pass ΣΔ Using an Accumulator

Figure 11:
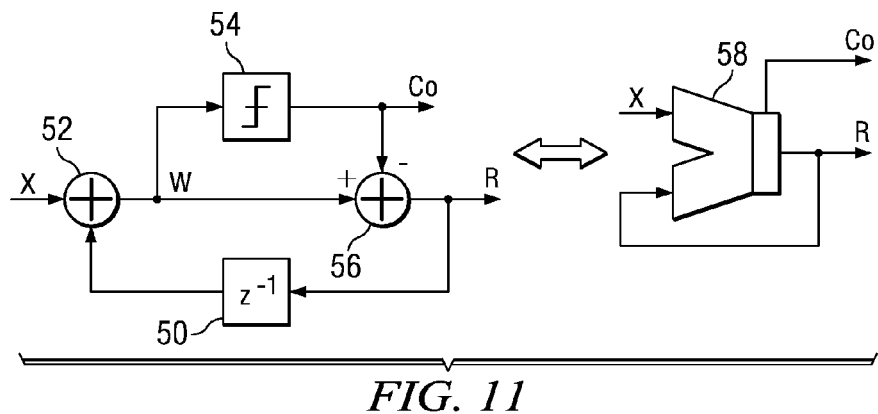
FIG. 11 is a block diagram illustrating a $1^{st}$ order MASH structure $\Sigma\Delta$ converter using an accumulator.

A block diagram illustrating a $1^{st}$ order ΣΔ modulator is shown in FIG. 11. The ΣΔ converter comprises a delay element 50, summers 52, 56 and a comparator 54. The converter circuit can be equivalently represented as an accumulator 58. From the block diagram the following can be derived:

$$W_1(z) = X(z) + R_1(z)Z^{-1} \tag{18}$$

$$W_1(z) + E_1(z) = Co_1 \tag{19}$$

$$R_1(z) = W_1(z) - Co_1 \tag{20}$$

Substituting (20) into (18) results in:

$$W_1(z) = X(z) + (W_1(z) - Co_1)Z^{-1}$$

$$W_1(z) - W_1(z)Z^{-1} = X(z) - Co_1 Z^{-1}$$

$$W_1(z)(1 - Z^{-1}) = X(z) - Co_1 Z^{-1} \tag{21}$$

From (19)→$W_1(z) = Co_1 - E_1(z)$, substituting into (21) yields $$(Co_1 - E_1(z))(1 - Z^{-1}) = X(z) - Co_1 Z^{-1}$$

$$Co_1(1 - Z^{-1}) = X(z) - Co_1 Z^{-1} + E_1(z)(1 - Z^{-1})$$

The equation for a first order low pass ΣΔ is therefore given by:

$$Co_1 = X(z) + E_1(z)(1 - Z^{-1}) \tag{22}$$

From (21)

$$W_1(z) = \frac{X(z) - CO_1 Z^{-1}}{(1 - Z^{-1})}.$$

Substituting in (20) results in:

$$R_1(z) = \frac{X(z) - Co_1 Z^{-1}}{(1 - Z^{-1})} - \frac{Co_1(1 - Z^{-1})}{(1 - Z^{-1})} \tag{23}$$

$$= \frac{X(z) - Co_1}{(1 - Z^{-1})}$$

Figure 12:
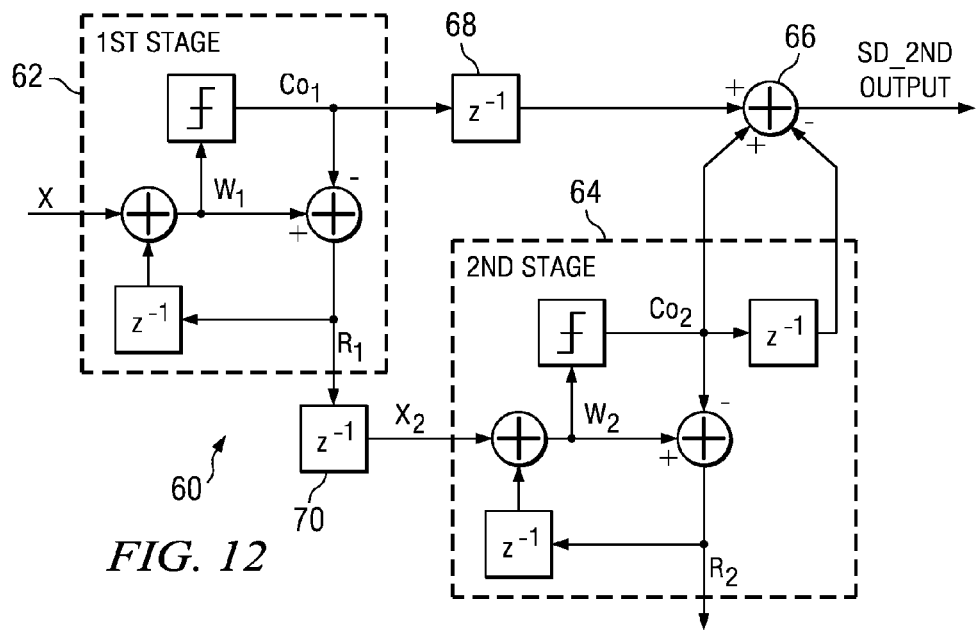
FIG. 12 is a block diagram illustrating a $2^{nd}$ order MASH structure $\Sigma\Delta$ converter constructed using the $1^{st}$ order $\Sigma\Delta$ converter as a building block.

$2^{nd}$ Order Low Pass ΣΔ Converter Using the $1^{st}$ Order as a Building Block Treating the $2^{nd}$ stage as a $1^{st}$ order ΣΔ, we can reuse the above equations. As shown in FIG. 12, $R_1(z)$ can be used as the input signal to the second block. The $2^{nd}$ order ΣΔ converter, generally referenced 60, comprises two $1^{st}$ order stages 62, 64 coupled via delay elements 68, 70. The output is generated by summer 66. From (23) we write:

$$X_2(z) = R_1(z)Z^{-1} = \frac{(X(z) - Co_1)Z^{-1}}{(1 - Z^{-1})} \tag{24}$$

From (22) we write:

$$Co_2 = X_2(z) + E_2(z)(1 - Z^{-1}) \tag{25}$$

Substituting (23) into (22) gives $$Co_2 = \frac{(X(z) - Co_1)Z^{-1}}{(1 - Z^{-1})} + E_2(z)(1 - Z^{-1})$$

$$Co_2(1 - Z^{-1}) = X_2(z)Z^{-1} - Co_1 + E_2(z)(1 - Z^{-1})^2$$

Thus, the equation for a $2^{nd}$ order low pass ΣΔ is given by:

$$Co_2 - Co_2 Z^{-1} + Co_1 Z^{-1} = X_2(z)Z^{-1} + E_2(z)(1 - Z^{-1}) \tag{26}$$

Figure 13:
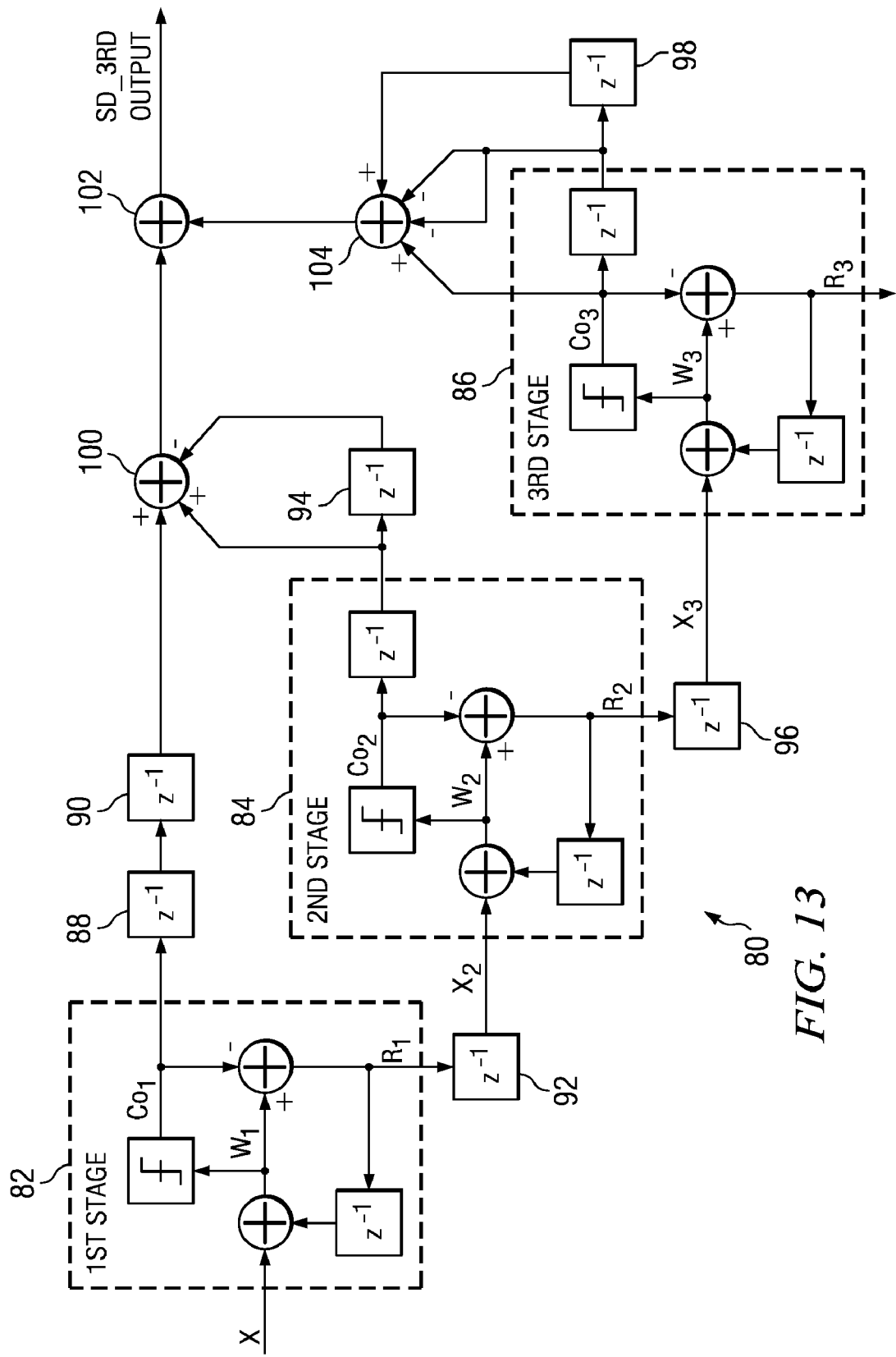
FIG. 13 is a block diagram illustrating a $3^{rd}$ order MASH structure $\Sigma\Delta$ converter constructed using the $1^{st}$ order $\Sigma\Delta$ converter as a building block.

$3^{rd}$ Order Low Pass ΣΔ Converter Using the $1^{st}$ Order as a Building Block Treating the $2^{nd}$ and $3^{rd}$ stages as $1^{st}$ order ΣΔs, we can reuse the above equations. As shown in FIG. 13, R(z) can be used as the input signal to the second and third blocks. The $3^{rd}$ order ΣΔ converter, generally referenced 80, comprises three $1^{st}$ order stages 82, 84, 86, delay elements 88, 90, 92, 94, 96, 98 and summers 100, 102, 104. The output is generated by summer 102. From (23), $$R_2(z) = \frac{X_2(z) - Co_2}{(1 - Z^{-1})}, \tag{27}$$

since $$X_2(z) = \frac{(X(z) - Co_1)Z^{-1}}{(1 - Z^{-1})}$$

$$R_2(z) = \frac{\frac{(X(z) - Co_1)Z^{-1}}{(1 - Z^{-1})} - Co_2}{(1 - Z^{-1})}$$

$$X_3(z) = R_2(z)Z^{-1}$$

$$X_3(z) = \frac{(X(z) - Co_1)Z^{-2} - Co_2(1 - Z^{-1})Z^{-1}}{(1 - Z^{-1})^2}$$

Using (22), $Co_3 = X_3(z) + E_3(z)(1 - Z^{-1})$, substituting (27) results in $$Co_3 = \frac{(X(z) - Co_1)Z^{-2} - Co_2(1 - Z^{-1})Z^{-1}}{(1 - Z^{-1})^2} + E_3(z)(1 - Z^{-1})$$

$$Co_3(1 - Z^{-1})^2 = X(z)Z^{-2} - Co_1 Z^{-2} - Co_2(1 - Z^{-1})Z^{-1} + E_3(z)(1 - Z^{-1})^3$$

Therefore, the equation for a $3^{rd}$ order low pass ΣΔ is given by:

$$Co_3(1 - 2Z^{-1} + Z^{-2}) + Co_1 Z^{-2} - Co_2(Z^{-1} - Z^{-2}) = X(z)Z^{-2} + E_3(z)(1 - Z^{-1})^3 \tag{28}$$

Figure 14:
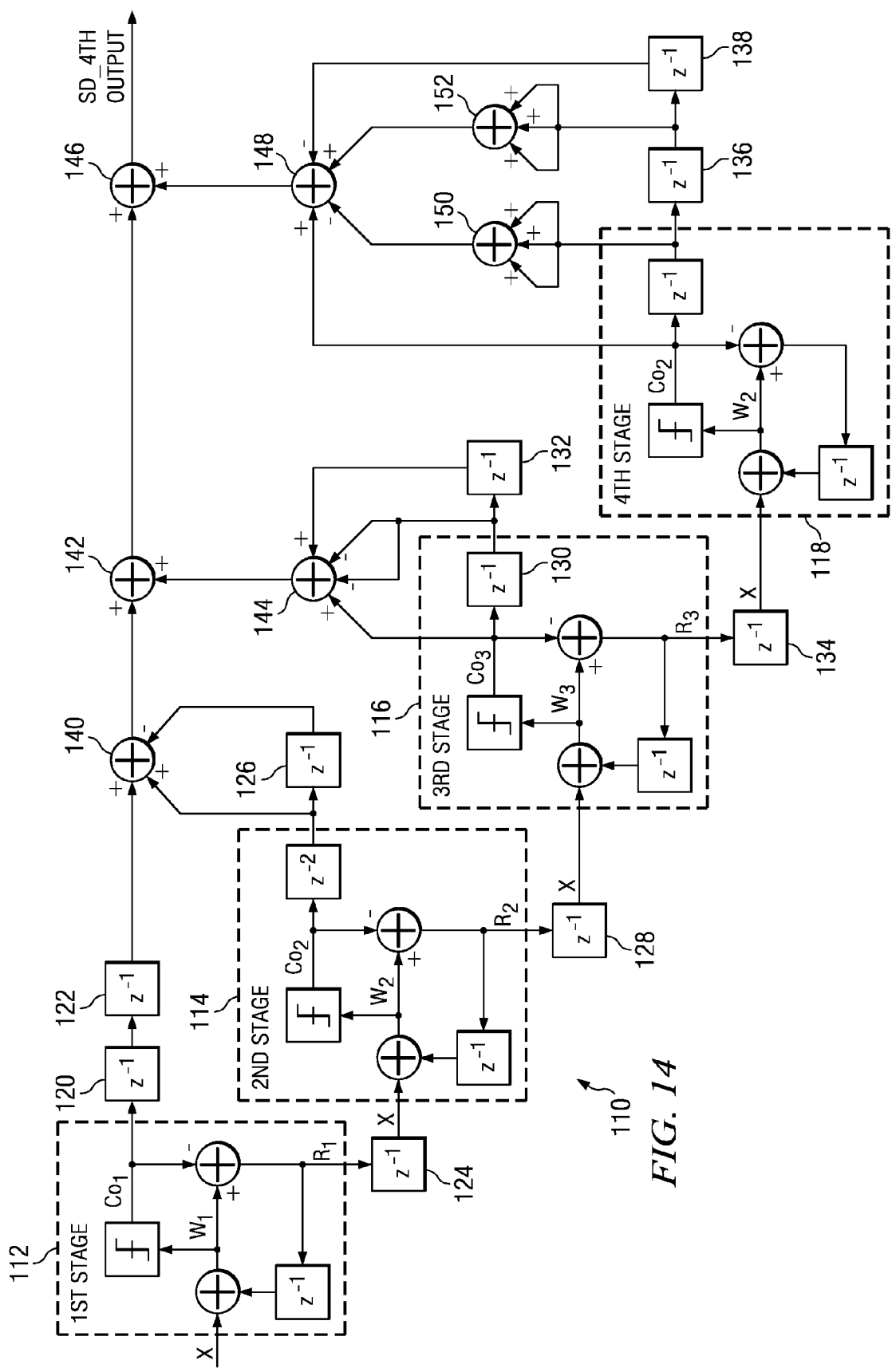
FIG. 14 is a block diagram illustrating a $4^{th}$ order low pass MASH structure $\Sigma\Delta$ converter constructed using the $1^{st}$ order $\Sigma\Delta$ converter as a building block.

$4^{th}$ Order Low Pass $\Sigma\Delta$ Converter Using the $1^{st}$ Order as a Building Block Treating the $2^{nd}$, $3^{rd}$ and $4^{th}$ stages as $1^{st}$ order $\Sigma\Delta$, we can reuse the above equations. As shown in FIG. 14, R(z) can be used as the input signal to the second, third and fourth blocks. The $4^{th}$ order $\Sigma\Delta$ converter, generally referenced 110, comprises four $1^{st}$ order stages 112, 114, 116, 118, delay elements 120, 122, 124, 126, 128, 130, 132, 134, 136, 138 and summers 140, 142, 144, 146, 148, 150, 152. The output is generated by summer 146. From (23)

$$R_3(z) = \frac{X_3(z) - Co_3}{(1-Z^{-1})},$$

since $$X_3(z) = \frac{(X(z) - Co_1)Z^{-2} - Co_2(1-Z^{-1})Z^{-1}}{(1-Z^{-1})^2}$$

from (27)

$$R_3(z) = \frac{\frac{(X(z)-Co_1)Z^{-2}-Co_2(1-Z^{-1})Z^{-1}}{(1-Z^{-1})^2} - Co_3}{(1-Z^{-1})}$$

$$= \frac{(X(z)-Co_1)Z^{-2}-Co_2(1-Z^{-1})Z^{-1}-Co_3(1-Z^{-1})^2}{(1-Z^{-1})^3}$$

$$X_4(z) =$$

$$R_3(z)Z^{-1} = \frac{(X(z)-Co_1)Z^{-3}-Co_2(1-Z^{-1})Z^{-2}-Co_3Z^{-1}(1-Z^{-1})^2}{(1-Z^{-1})^3}$$

$$Co_4 = X_4(z) + E_4(z)(1-Z^{-1})$$

$$= \frac{(X(z)-Co_1)Z^{-3}-Co_2(1-Z^{-1})Z^{-2}-Co_3Z^{-1}(1-Z^{-1})^2}{(1-Z^{-1})^3} + E_4(z)(1-Z^{-1})$$

$$Co_4(1-Z^{-1})^3 = X(z)Z^{-3} - Co_1Z^{-3} -$$
$$Co_2(1-Z^{-1})Z^{-2} - Co_3Z^{-1}(1-Z^{-1})^2 + E_4(z)(1-Z^{-1})^4$$

Thus, the equation for a $4^{th}$ order low pass $\Sigma\Delta$ is given by:

$$Co_4(1-3Z^{-1}+3Z^{-2}-Z^{-4})+Co_1Z^{-3}+Co_2(1-Z^{-1})Z^{-2}+$$
$$Co_3Z^{-1}(1-2Z^{-1}+Z^{-2})=X(z)Z^{-3}+E_4(z)(1-Z^{-1})^4$$

Figure 15A:
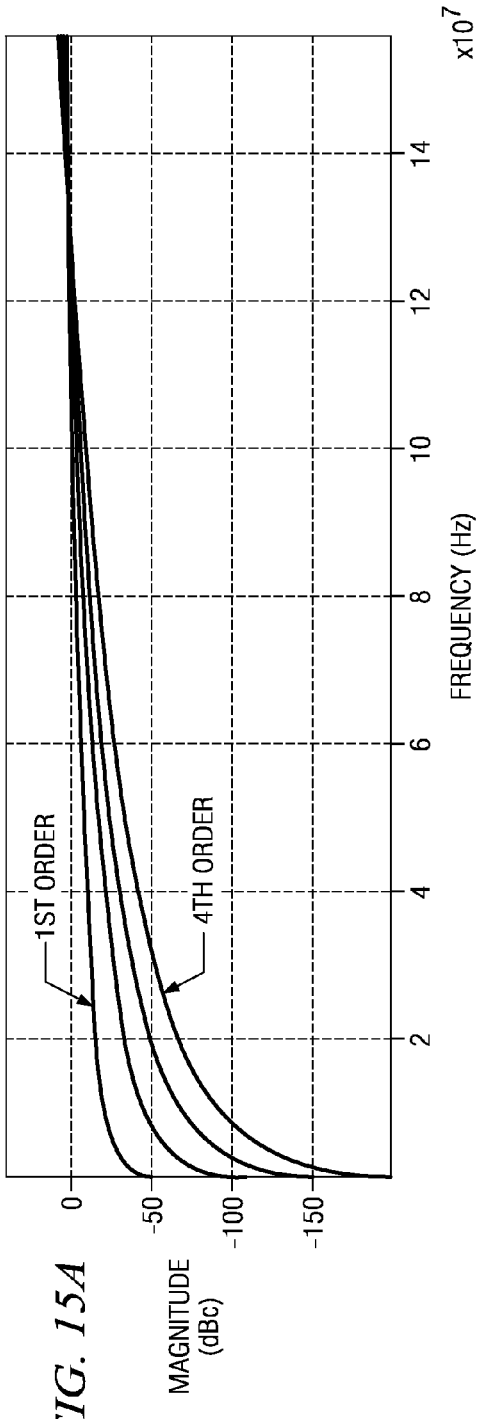
FIGS. 15A and 15B are plots illustrating the frequency response of $1^{st}$, $2^{nd}$, $3^{rd}$ and $4^{th}$ order MASH structure $\Sigma\Delta$ modulators.
Figure 15B:
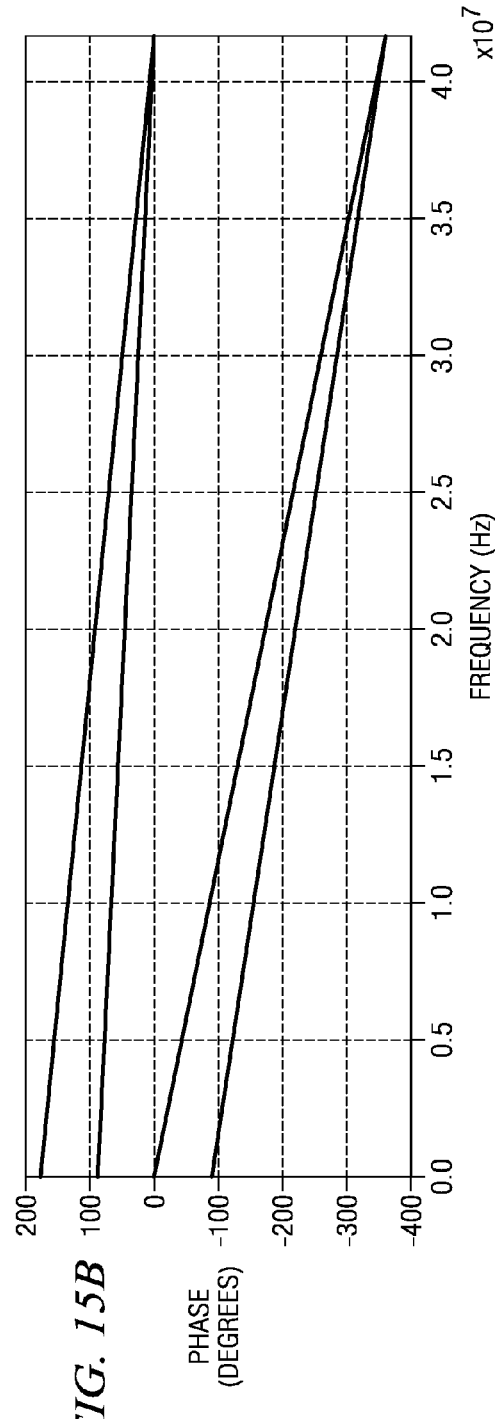

FIGS. 15A and 15B show the frequency response of the modulator with $1^{st}$, $2^{nd}$, $3^{rd}$ and $4^{th}$ orders.

SAM Block Performance

The performance of the SAM block output can be found by overlaying the noise density of Equation (9) on top of Equation (16). At each frequency point the power spectral density of (9) versus (16) is compared. The one with the highest value is selected to get the total theoretical power spectral density of the output of the SAM block.

Figure 16:
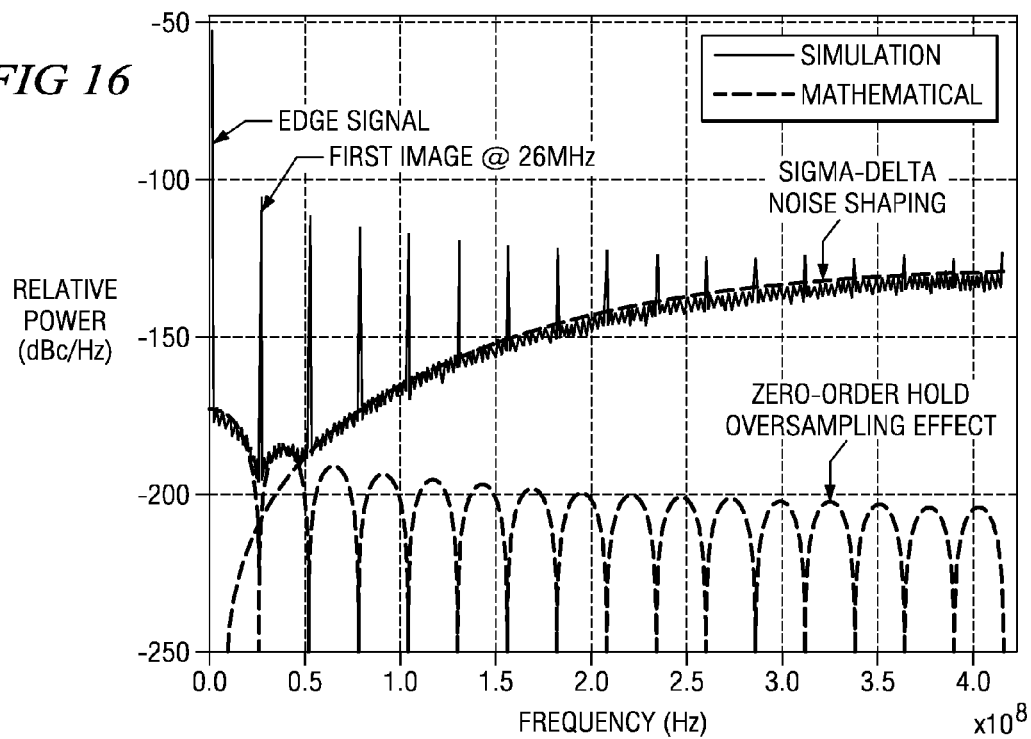
FIG. 16 is a plot illustrating the spectrum of the $4^{th}$ order MASH structure $\Sigma\Delta$ modulator.

This section illustrates the performance of the SAM block under different scenarios. A comparison is drawn between simulation output and the combination of Equations (9) and (16). Note that:

$N_i$ is the integer number of bits
$N_f$ is the fractional number of bits
$Fs_{bb}$ is the baseband sampling frequency
$Fs_{rf}$ is the RF sampling frequency The following three cases are tested wherein $Fs_{bb}=26$ MHz, $Fs_{rf}=832$ MHz is used for each case:

$4^{th}$ order sigma delta, $N_i=10$, $N_f=6$, $Fs_{bb}=26$ MHz, $Fs_{rf}=832$ MHz $2^{nd}$ order sigma delta, $N_i=10$, $N_f=6$, $Fs_{bb}=26$ MHz, $Fs_{rf}=832$ MHz $4^{th}$ order sigma delta, $N_i=8$, $N_f=4$, $Fs_{bb}=26$ MHz, $Fs_{rf}=832$ MHz For the first case, the following parameters were used: $N_i=10$, $N_f=6$, $Fs_{bb}=26$ MHz, $Fs_{rf}=832$ MHz, SD order=$4^{th}$. A spectrum plot of the relative power versus frequency for the $4^{th}$ order $\Sigma\Delta$ modulator is shown in FIG. 16.

Figure 17:
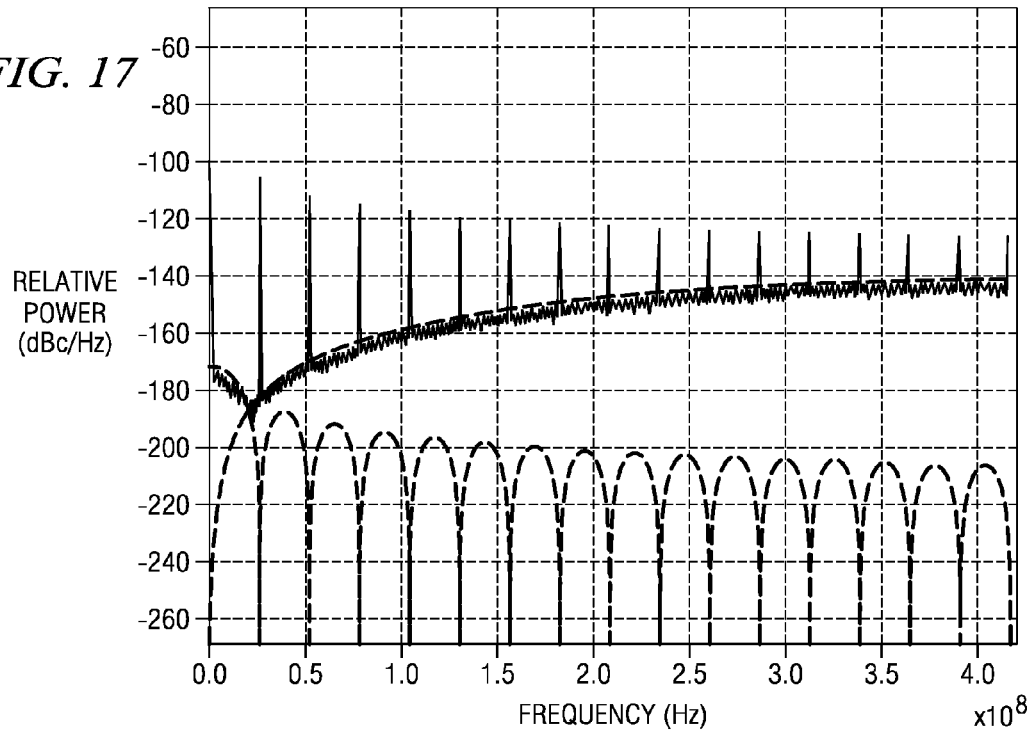
FIG. 17 is a plot illustrating the spectrum of the $2^{nd}$ order MASH structure $\Sigma\Delta$ modulator.

For the second case, the following parameters were used: $N_i=10$, $N_f=6$, $Fs_{bb}=26$ MHz, $Fs_{rf}=832$ MHz, SD order=$2^{nd}$. A spectrum plot of the relative power versus frequency for the $2^{nd}$ order $\Sigma\Delta$ modulator is shown in FIG. 17.

Figure 18:
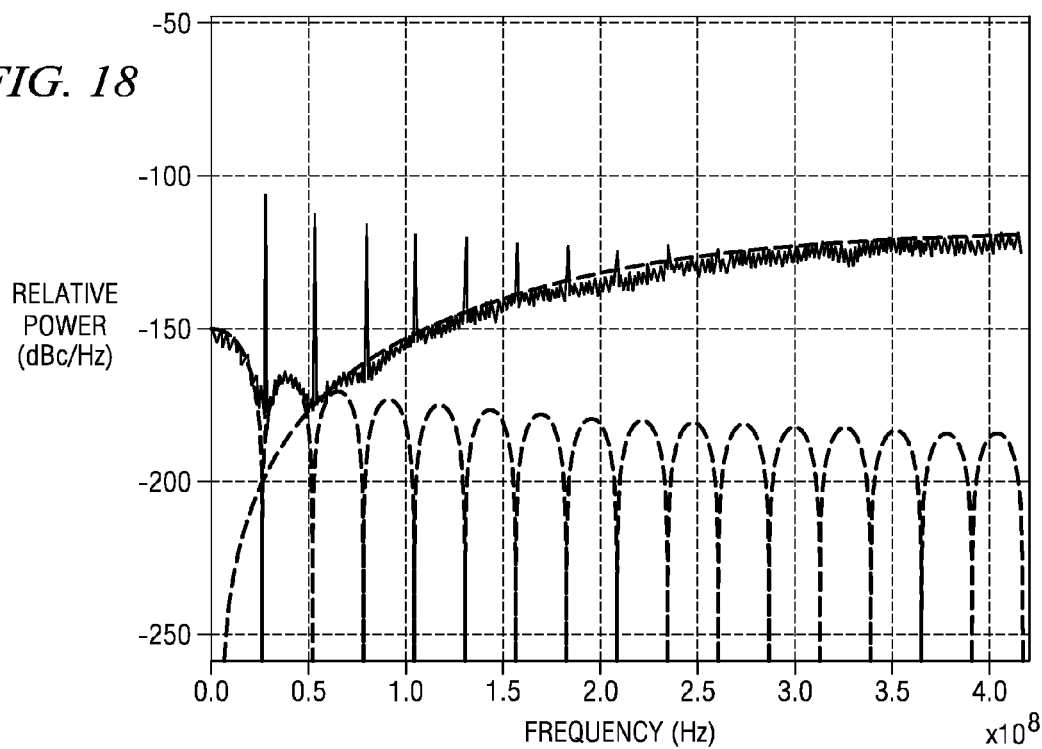
FIG. 18 is a plot illustrating the spectrum of a $4^{th}$ order MASH structure $\Sigma\Delta$ modulators with different bit allocation to integer and fractional parts.

For the third case, the following parameters were used: $N_i=8$, $N_f=4$, $Fs_{bb}=26$ MHz, $Fs_{rf}=832$ MHz, SD order=$4^{th}$. A spectrum plot of the relative power versus frequency for the $4^{th}$ order Y-$\Delta$ modulator is shown in FIG. 18.

Adding Notches in High Frequency

The low pass sigma delta modulation yields good noise rejection in frequency regions near the carrier. Since the noise is shaped to have stronger spectral content at higher frequencies, other bands of interest may be impacted by the high level of emissions. In order to avoid such impact in the absence of a SAW filter that could suppress such out-of-band noise, the invention provides several features that are added to the basic SAM block.

Feed Forward Comb Filter

Figure 19:
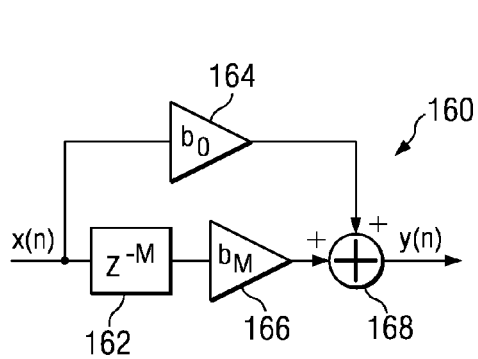
FIG. 19 is a block diagram illustrating a feed forward comb filter.

A comb filter is added to the SAM block in order to suppress unwanted spurs in the output spectrum. A feed forward comb filter is normally implemented as shown in FIG. 19, in which a direct signal x(n) feeds forward around the delay line 162 and sums with the delay line output via summer 168 and gain elements 164, 166. The difference equation for the feed forward Comb filter is given by $$y(n) = b_0 x(n) + b_M x(n-M)$$

The transfer function of the feed forward comb filter, assuming $b_0 = b_M = 0.5$, is $$H(z) = 0.5 \cdot (1 + Z^{-M})$$

Therefore, the magnitude response (gain versus frequency, wherein $-\pi \leq \omega \leq \pi$) can be written as $$G(\omega) = |H(e^{j\omega T_s})| = 0.5 \cdot |1 + e^{-j\omega T_s M}| \qquad (29)$$

$$= 0.5 * \left|e^{-j\omega T_s \frac{M}{2}}\right| \left|e^{j\omega T_s \frac{M}{2}} + e^{-j\omega T_s \frac{M}{2}}\right| = \left|\cos\left(\omega T_s \frac{M}{2}\right)\right|$$

The relationship between the location of notches in the output spectrum and the value of M is described in the following equation:

$$f_{nx} = \left\{\frac{F_s(2k+1)}{2M}\right\}_{k=0}^{\infty},$$

where $$f_{nx} \leq \frac{F_s}{2}$$

For example, for M=6, the output spectrum will have notches at the following frequencies:

$$\frac{F_s}{12}, \frac{3F_s}{12} \text{ and } \frac{5F_s}{12}.$$

As the value of M increases, additional notches will appear in the output spectrum. The drawback is that the widths of these notches decreases as the number of notches increases.

Figure 20:
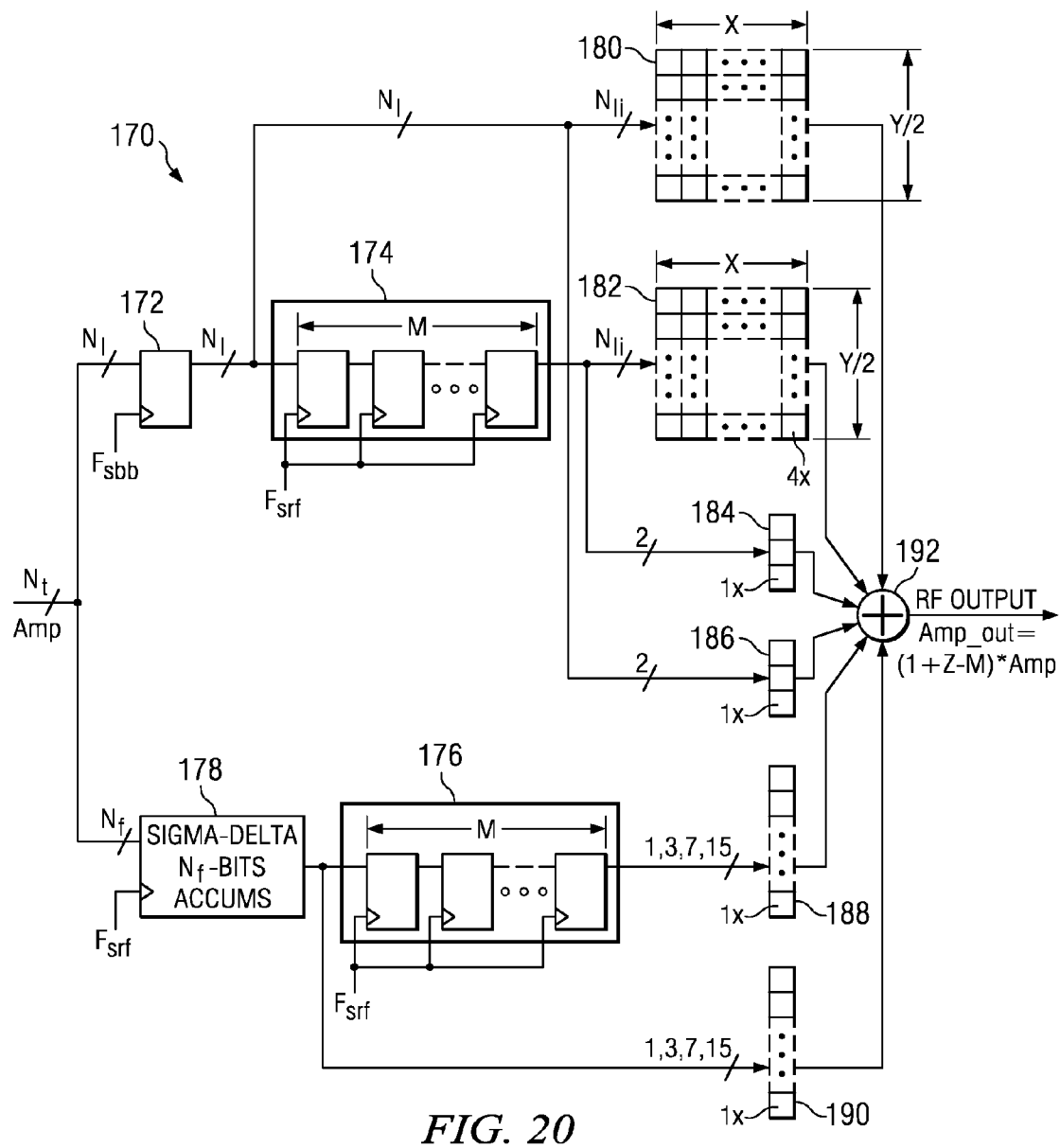
FIG. 20 is a block diagram illustrating a SAM block with comb filter attached.

FIG. 20 shows an example embodiment of the comb filter implemented in the SAM block as contemplated by the present invention. The SAM block, generally referenced 170, comprises register arrays 172, 174, 176, 180, 182, 184, 186, 188, 190, ΣΔ accumulator 178 and summer 192.

The number of integer bits used in this scenario is less than in the previous architecture by one bit. The reason is that the integer number of bits that can be used is derived from the number of transistors that can be implemented in the PPA. Since half the number of transistors must be used for the delayed version of the signal, the resolution of the signal is reduced by half, which is equivalent to one bit. The dimensions of the transistor matrix, however, remain the same. The maximum output power of the PPA is the same as the structure without the comb filter.

Equation (9) stated the power spectral density for the fractional part output from the ΣΔ:

$$P_{SD}(f)_{dBc/Hz} = 20\text{Log}_{10}\left|\sigma_e\sqrt{2T_{Srf}}\left[2\text{Sin}\left(\frac{\omega T_{Srf}}{2}\right)\right]^L\right| - 6 \cdot N_i - 3$$

Adding the effect of the comb filter using Equation (29) yields $$P_{SD\_Comb}(f)_{dBc/HZ} = \tag{30}$$

$$20\text{Log}_{10}\left(\left|\sigma_e\sqrt{2T_{Srf}}\left[2\text{Sin}\left(\frac{\omega T_{Srf}}{2}\right)\right]^L\right|\left|\text{Cos}\left(\frac{\omega T_{Srf}M}{2}\right)\right|\right) - 6 \cdot N_i - 3$$

Similarly, Equation (16) stated the power spectral density of the Nyquist quantization noise $$P_{Nyq}(f)_{dBc/Hz} =$$

$$-6 \cdot (N_i + N_f) - 10\text{Log}_{10}\left(\frac{F_{Sbb}}{2}\right) - 3 + S_x + 20\text{Log}_{10}\left(\left|\frac{\text{Sin}(\pi fT_{sbb})}{(\pi fT_{sbb})}\right|\right)$$

Adding the effect of the comb filter using Equation (29) gives $$P_{Nyq\_Comb}(f)_{dBc/Hz} = -6 \cdot (N_i + N_f) - 10\text{Log}_{10}\left(\frac{F_{Sbb}}{2}\right) - \tag{31}$$

$$3 + S_x + 20\text{Log}_{10}\left(\left|\frac{\text{Sin}(\pi fT_{sbb})}{(\pi fT_{sbb})}\right|\left|\text{Cos}\left(\frac{\omega T_{Srf}M}{2}\right)\right|\right)$$

Figure 21:
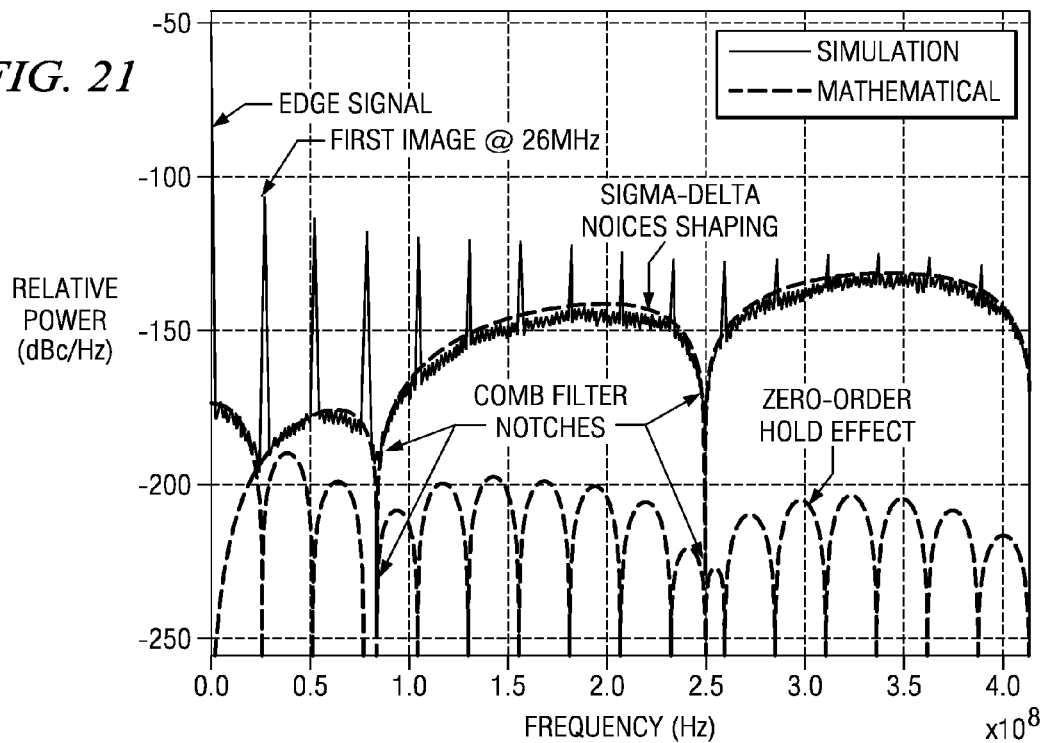
FIG. 21 is a plot illustrating the spectrum of a $3^{rd}$ order MASH structure $\Sigma\Delta$ modulator and comb filter.

A plot illustrating an example of the output spectrum of the SAM block with the parameters: $N_i=9$, $N_f=7$, $3^{rd}$ order ΣΔ, $F_{Sbb}=26$ MHz, $F_{Srf}=832$ MHz, and comb filter M=5, is shown in FIG. 21.

Comb Filter With Additional Fingers

Figure 22:
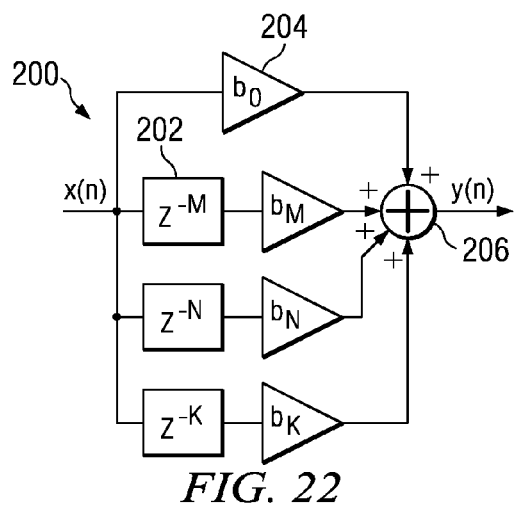
FIG. 22 is a block diagram illustrating a feed forward four finger comb filter.

To have more programmability in the location of the notches you can increase the number of fingers. FIG. 22 illustrates a Comb filter comprising four fingers. The transfer function of the Comb filter assuming $b_0=b_M=b_N=b_k=0.25$ is give by $$H(z)=0.25*(1+Z^{-M}+Z^{-N}+Z^{-K}) \tag{32}$$

where N≧M, and K≧N.

The magnitude response (gain versus frequency) is therefore given by $$G(\omega)=|H(e^{j\omega TS})|=0.25*|1+e^{-j\omega TSN}+e^{-j\omega TSK}| \tag{33}$$

where $-\pi \leq \omega \leq \pi$.

Additional fingers provides for more programmability to place notches at specific frequencies. A disadvantage is that 1-bit of resolution is lost each time the number of finger is doubled. For example, consider a PPA having a fixed number of 256 elements. The 256 elements are equivalent to 8-bits of Nyquest resolution. With a Comb filter comprising two fingers, half of this matrix is used for the signal and the other half is used for the delayed version. Therefore, half of the matrix of transistors is lost in order to achieve the notches. With four fingers, the matrix is divided into four smaller portions, each of which receives the same amplitude information but at different delay times. This represents a drop in resolution from 8-bits to 6-bits.

Figure 23A:
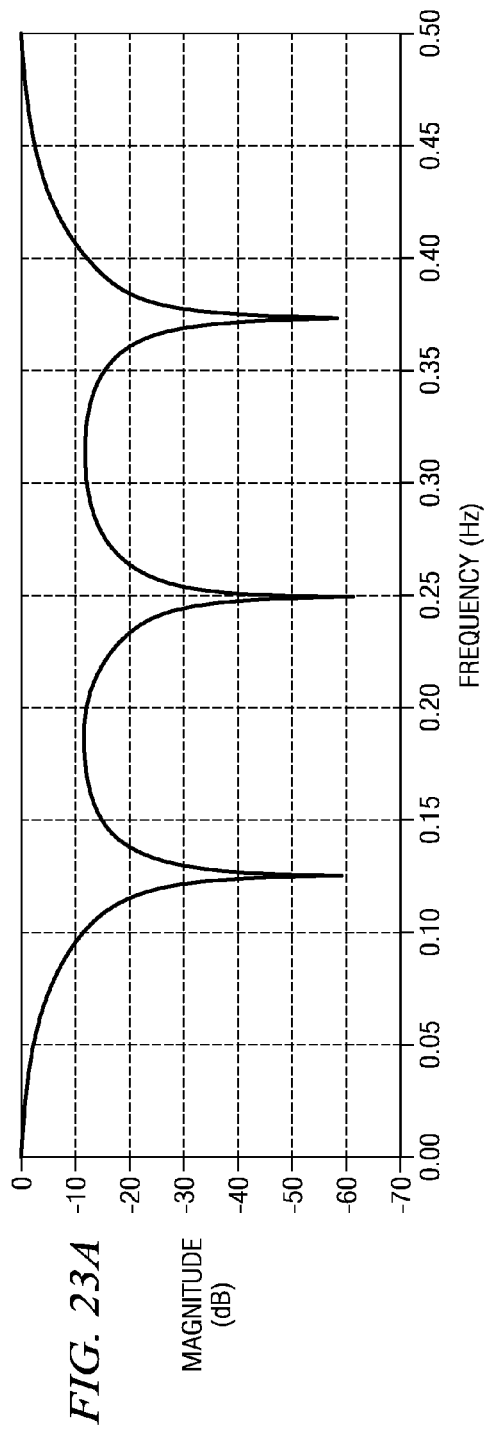
FIGS. 23A and 23B are plots illustrating the frequency notches at Fs/8, Fs/4 and 3Fs/8.
Figure 23B:
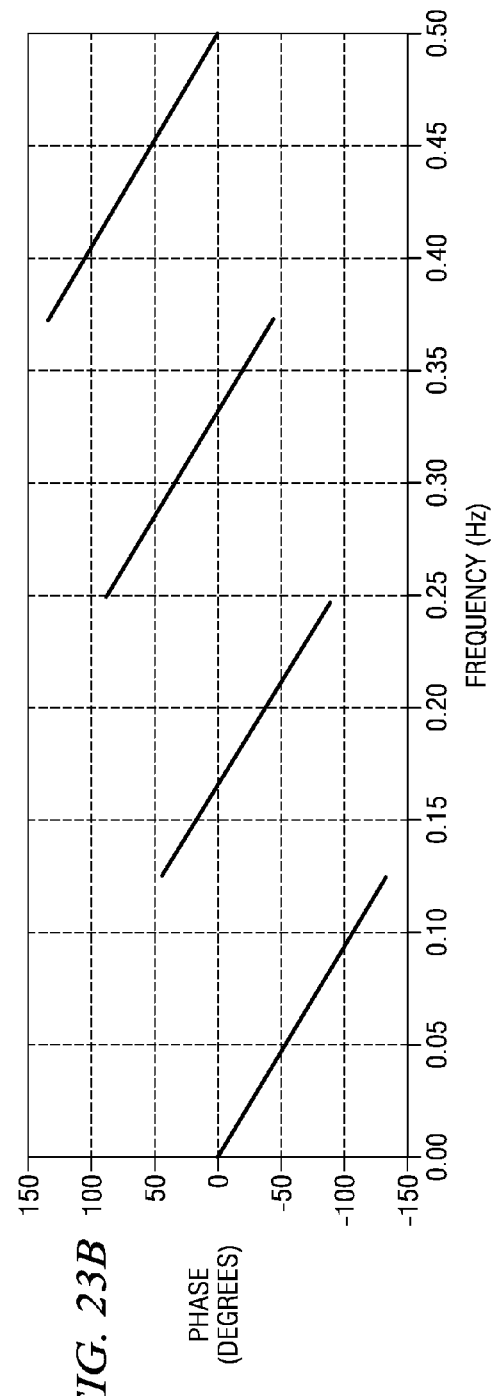

Having extra fingers available can be advantageous in a number of applications. As an example, consider DCS high band with data input from DTX sampled at CKVD8, images of CKVD8 at Fs/8, Fs/4 and 3Fs/8 will rise and likely violate cellular frequency band restrictions, assuming that sampling frequency is CKV. To meet cellular specifications, it is typically required to suppress all images at the same time. This cannot be achieved using less than four fingers. These frequencies can be notched out using four fingers with M=2, N=4 and K=6. FIGS. 23A and 23B show the magnitude and phase frequency response including the notches assuming Fs=1 at Fs/8, Fs/4 and 3Fs/8.

SAM Structure With Comb Filter

Figure 24:
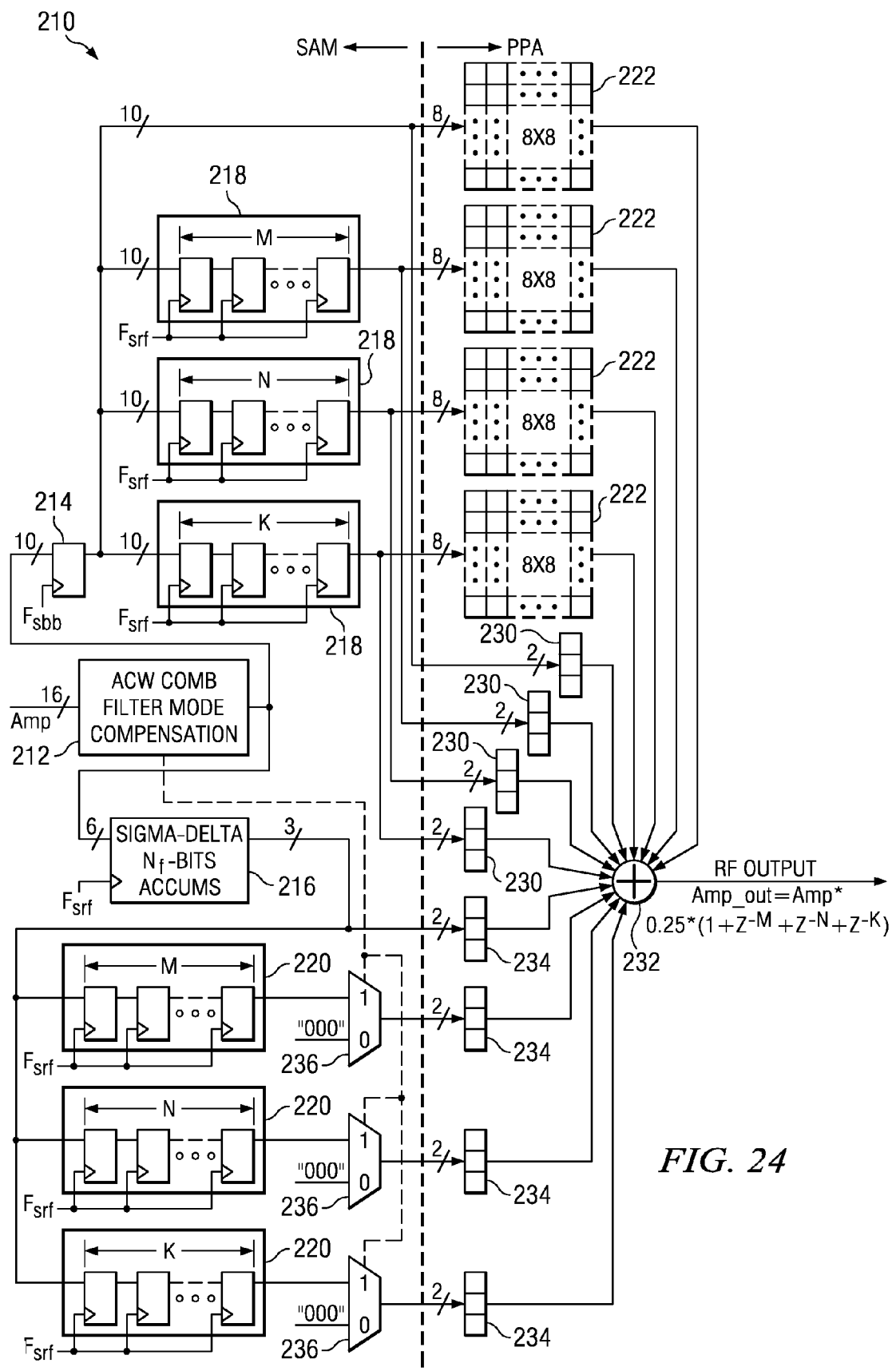
FIG. 24 is a block diagram illustrating a SAM block incorporating a comb filter.

An example embodiment illustrating a SAM block comprising a Comb filter as contemplated by the present invention is shown in FIG. 24. The SAM block, generally referenced 210, comprises register arrays 214, 218, 220, 222, 230, 234, ΣΔ accumulator 216, ACW Comb filter compensation block 212, multiplexers 236 and summer 232.

Figure 25:
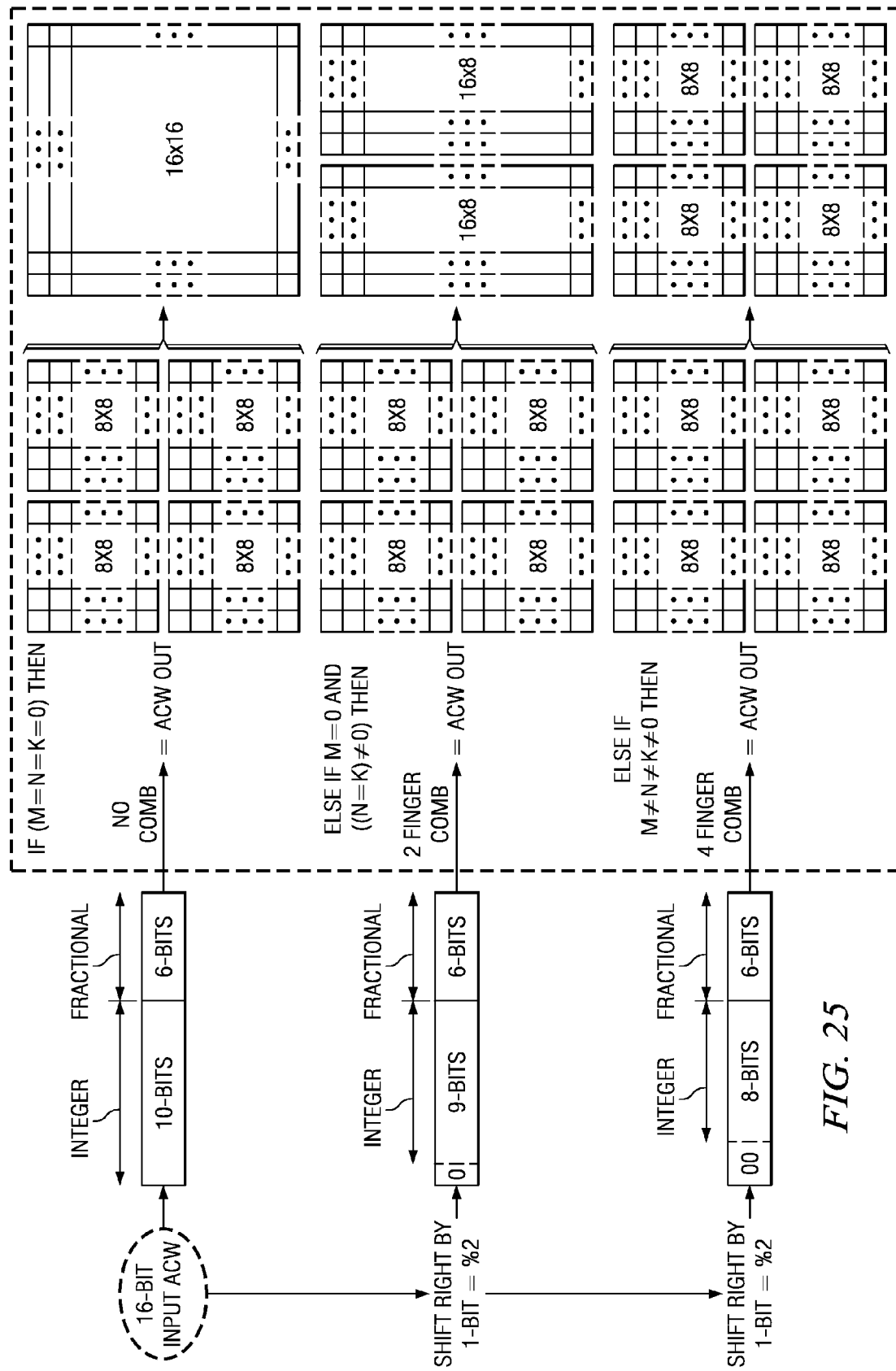
FIG. 25 is a block diagram illustrating amplitude control word (ACW) comb filter mode compensation.

When using a Comb filter the PPA is divided into a number of sections equal to the number of fingers in the Comb filter. The example SAM block illustrated in FIG. 24 shows a Comb filter comprising four fingers. The 256 transistor matrix of the PPA is divided into four sections, with each section comprising 64 transistors. The 16-bit amplitude control word input must be modified to fit the Comb mode as shown in FIG. 25 and as described below:

1. No comb used: In this mode the four PPA section are treated as one block of 256 elements of 8-bits resolution and the amplitude input has the full range of 16-bits.

2. Comb filter with two fingers: The four PPA sections are treated as two blocks of 128 elements each. One block received a 7-bit resolution signal and the other receives the delayed version.
3. Comb filter with four fingers: The four PPA sections are treated as individual sections wherein each receives a 6-bit signal but with a different delay time from the others.

Equation (9) stated the power spectral density for the fractional part coming out of the sigma-delta $$P_{SD}(f)_{dBc/Hz} = 20\text{Log}_{10}\left|\sigma_e\sqrt{2T_{Srf}}\left[2\text{Sin}\left(\frac{\omega T_{Srf}}{2}\right)\right]^L\right| - 6*N_i - 3 \quad (9)$$

Adding the effect of the two-finger Comb filter using Equation (34) below $$= 0.5*\left|e^{-j\omega T_s \frac{M}{2}}\right|\left|e^{j\omega T_s \frac{M}{2}} + e^{-j\omega T_s \frac{M}{2}}\right| = \left|\text{Cos}\left(\omega T_s \frac{M}{2}\right)\right| \quad (34)$$

yields $$P_{SD\_Comb}(f)_{dBc/Hz} = \quad (35)$$
$$20\text{Log}_{10}\left(\left|\sigma_e\sqrt{2T_{Srf}}\left[2\text{Sin}\left(\frac{\omega T_{Srf}}{2}\right)\right]^L\right|\left|\text{Cos}\left(\frac{\omega T_{Srf}M}{2}\right)\right|\right) - 6*N_i - 3$$

Similarly, the power spectral density of the Nyquist quantization noise is given as $$P_{Nyq(dBc/Hz)}(f) = \quad (36)$$
$$-6*(N_i + N_f) - 10\text{Log}_{10}\left(\frac{F_{Sbb}}{2}\right) - 3 + S_x + 20\text{Log}_{10}\left(\left|\frac{\text{Sin}(\pi fT_{sbb})}{(\pi fT_{sbb})}\right|\right)$$

Adding the effect of the two-finger Comb filter using Equation (34) yields $$P_{Nyq-Comb}(f)_{dBc/Hz} = -6*(N_i + N_f) - 10\text{Log}_{10}\left(\frac{F_{Sbb}}{2}\right) - \quad (37)$$
$$3 + S_x + 20\text{Log}_{10}\left(\left|\frac{\text{Sin}(\pi fT_{sbb})}{(\pi fT_{sbb})}\right|\left|\text{Cos}\left(\frac{\omega T_{Srf}M}{2}\right)\right|\right)$$

It is appreciated by one skilled in the art that equations for the four-finger Comb filter mode can be generated in a similar manner.

Several examples of SAM block settings are provided to illustrate the combined effect of the Comb filter at different settings and sigma-delta modulator.

Figure 26:
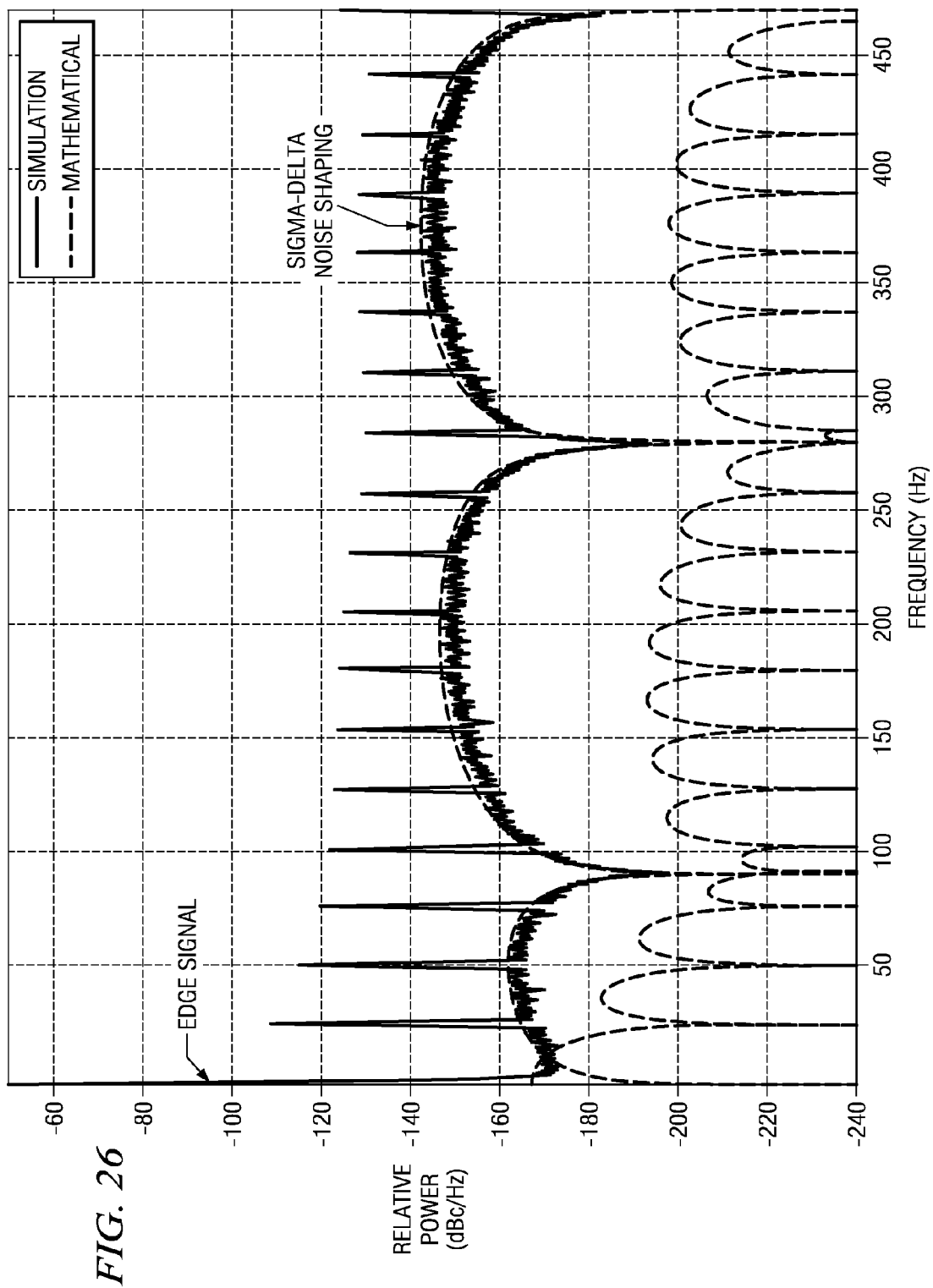
FIG. 26 is a plot illustrating the SAM block output with $1^{st}$ order MASH structure $\Sigma\Delta$ and comb filter of M=5.

Case 1:
In a first example $N_i=10$, $N_f=6$, the sigma delta is $1^{st}$ order, $F_{Sbb}=26$ MHz, $F_{Srf}=936$ MHz, and a two-finger Comb filter is used with M=5. A frequency response plot for this example is illustrated in FIG. 26. The Comb filter notches and sigma delta noise shaping are indicated by the arrows. The simulation plot is shown by the solid line while the mathematical plot is shown by the dashed line.

Figure 27:
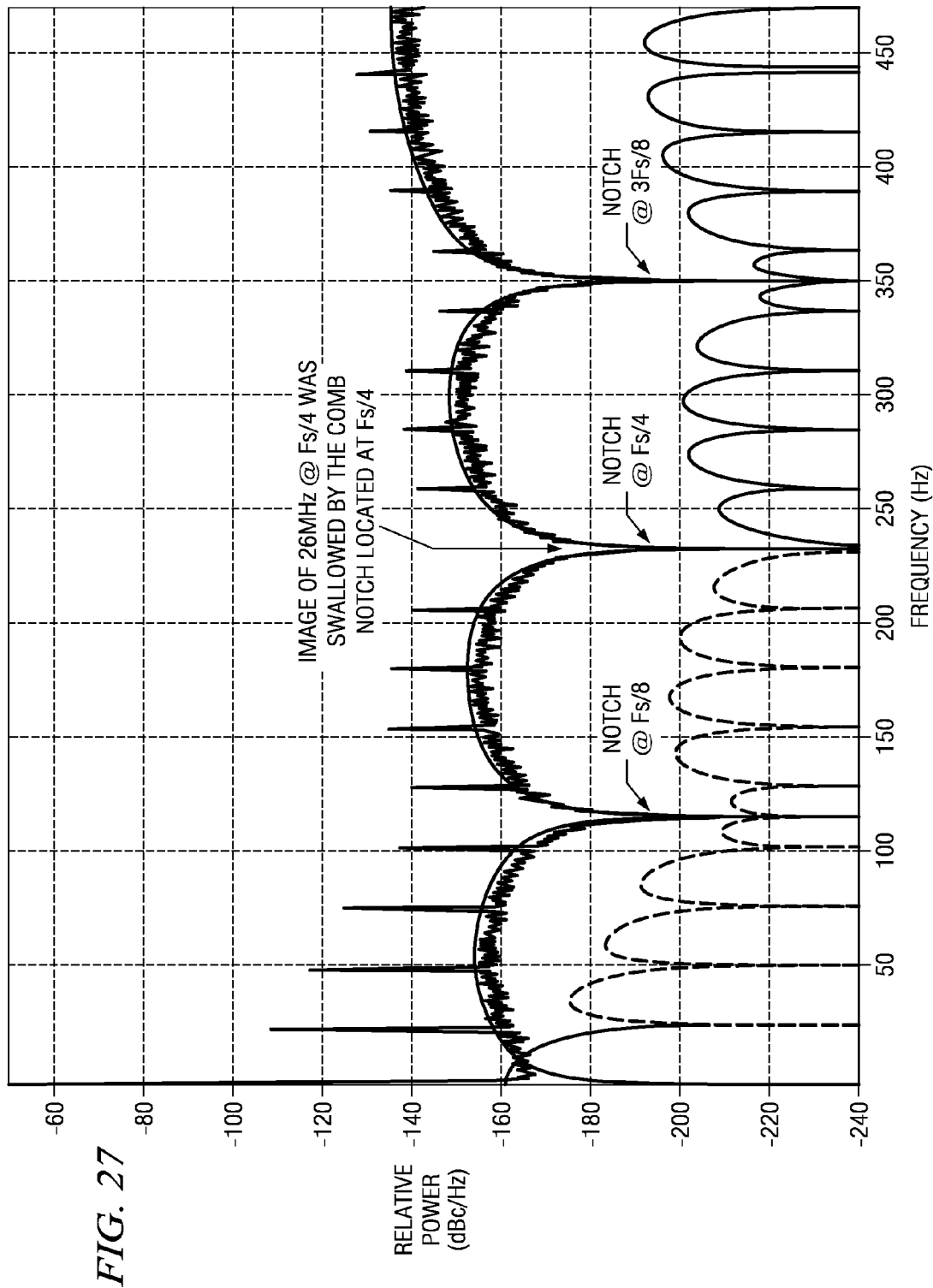
FIG. 27 is a plot illustrating the SAM block output with $1^{st}$ order MASH structure $\Sigma\Delta$ and 4 finger comb filter with M1=2, M2=4, M3=6.

Case 2:
In a second example, $N_i=10$, $N_f=6$, the sigma delta is $1^{st}$ order, $F_{Sbb}=26$ MHz, $F_{Srf}=936$ MHz, and a four finger Comb filter is used with M1=2, M2=4 and M3=6. A frequency response plot for this example is illustrated in FIG. 27. The Comb filter notches are indicated by the arrows. The simulation plot is shown by the solid line while the mathematical plot is shown by the dashed line.

Considering Case 2, one can see that because $F_{Srf}=36*F_{Sbb}$, and because one of the notches exists at $F_{Srf}/4$ which is the exact location as $9*F_{Sbb}$, that notch swallowed the corresponding sampling image. This feature of the present invention thus provides a useful benefit in DCS band communications considering the wide range of possible requirements of such systems.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A modulator, comprising:
   a filter compensator having an input for receiving an amplitude information signal;
   a transistor array coupled to an output of said filter compensator and comprising a plurality of transistors adapted to generate an output signal whose amplitude is substantially proportional to the number of transistors active at any one time in said array;
   a sigma delta modulator having an associated noise transfer function and coupled to said output of said filter compensator, said sigma delta modulator comprising:
      one or more concatenated first order sigma delta stages;
      a first combiner for combining the output of each of said one or more concatenated first order sigma delta stages to yield an output therefrom; and
   a second combiner for combining the output of said transistor array and said sigma delta modulator to generate a dithered amplitude signal therefrom and to selectively attenuate a noise transfer function at one or more selected frequencies.

2. The modulator according to claim 1, wherein said sigma delta modulator noise transfer function (NTF) comprises four zeros and no poles thereby creating two spectral notches.

3. The modulator according to claim 1, wherein said sigma delta modulator comprises one sigma delta stage.

4. The modulator according to claim 1, wherein said sigma delta modulator comprises two sigma delta stages.

5. The modulator according to claim 1, wherein said sigma delta modulator comprises three sigma delta stages.

6. The modulator according to claim 1, wherein said sigma delta modulator comprises four sigma delta stages.

7. The modulator according to claim 1, wherein said sigma delta modulator further comprises a compensation block operative to compensate said amplitude control word (ACW).

8. The modulator according to claim 1, adapted to be implemented in an Application Specific Integrated Circuit (ASIC).

9. The modulator according to claim 1, adapted to be implemented in a Field Programmable Gate Array (FPGA).

10. A modulator, comprising:
a filter compensator;
a first comb filter comprising a first plurality of fingers coupled to an output of said filter compensator;
a plurality of transistor arrays, each said transistor array coupled to the output of one of said fingers of said first comb filter and comprising a plurality of transistors adapted to generate an output signal whose amplitude is substantially proportional to the number of transistors active at any one time in said array;
a sigma delta modulator having an associated noise transfer function and coupled to said filter compensator, said sigma delta modulator comprising:
one or more concatenated first order sigma delta stages;
a first combiner for combining the output of each of said one or more concatenated first order sigma delta stages to yield an output therefrom;
a second comb filter comprising a second plurality of fingers coupled to the output of said sigma delta modulator; and
a second combiner for combining the output of said first comb filter and said second comb filter to generate a dithered amplitude signal therefrom wherein a noise transfer function is selectively attenuated at one or more selected frequencies.

11. The modulator according to claim 10, wherein said sigma delta modulator noise transfer function (NTF) comprises four zeros and no poles thereby creating two spectral notches.

12. The modulator according to claim 10, wherein said sigma delta modulator comprises one sigma delta stage.

13. The modulator according to claim 10, wherein said sigma delta modulator comprises two sigma delta stages.

14. The modulator according to claim 10, wherein said sigma delta modulator comprises three sigma delta stages.

15. The modulator according to claim 10, wherein said sigma delta modulator comprises four sigma delta stages.

16. The modulator according to claim 10, wherein said sigma delta modulator further comprises a compensation block operative to compensate said amplitude control word (ACW).

17. The modulator according to claim 10, adapted to be implemented in an Application Specific Integrated Circuit (ASIC).

18. The modulator according to claim 10, adapted to be implemented in a Field Programmable Gate Array (FPGA).

19. A radio frequency (RF) polar transmitter, comprising:
a first digital input coupled to an output of a filter compensator;
a second digital input coupled to an output of said filter compensator;
a frequency synthesizer coupled to said second digital input and operative to generate a phase modulated carrier signal in accordance with frequency control word signal;
a sigma delta modulator having an associated noise transfer function and coupled to said first digital input, said sigma delta modulator comprising:
a first input for receiving an amplitude control word as an integer portion signal and a fractional portion signal;
a first comb filter comprising a first plurality of fingers coupled to said integer portion signal of said first input;
a plurality of transistor arrays, each said transistor array coupled to the output of one said fingers of said first comb filter and comprising a plurality of transistors adapted to generate an output signal whose amplitude is substantially proportional to the number of transistors active at any one time in said array;
a sigma delta modulator having an associated noise transfer function and coupled to said fractional portion signal of said first input, said sigma delta modulator comprising:
one or more concatenated first order sigma delta stages;
a first combiner for combining the output of each of said one or more concatenated first order sigma delta stages to yield an output therefrom;
a second comb filter comprising a second plurality of fingers coupled to the output of said sigma delta modulator;
a second combiner for combining the output of said first comb filter and said second comb filter to generate a dithered amplitude signal therefrom wherein a noise transfer function is selectively attenuated at one or more selected frequencies;
a digitally controlled amplifier comprising a plurality of discrete levels of amplitude and coupled to said frequency synthesizer and said sigma delta modulator, said amplifier operative to control the amplitude of said phase modulated carrier signal in accordance with said dithered amplitude control signal; and
wherein quantization noise exhibited by said amplifier is significantly attenuated at one or more selected frequencies.

20. The transmitter according to claim 19, wherein said frequency synthesizer comprises an all digital phase locked loop (ADPLL).

21. The transmitter according to claim 19, wherein said sigma delta modulator noise transfer function (NTF) comprises four zeros and no poles thereby creating two spectral notches.

22. The transmitter according to claim 19, adapted to be implemented in an Application Specific Integrated Circuit (ASIC).

23. The transmitter according to claim 19, adapted to be implemented in a Field Programmable Gate Array (FPGA).

24. A polar transmitter, comprising:
a first input for receiving an amplitude information signal as an integer portion signal and a fractional portion signal;
a second input for receiving an angle information signal;
a filter compensator coupled to said first input;
a frequency synthesizer coupled to an output of said filter compensator and operative to generate an angle modulated carrier signal in accordance with said angle information signal;
a sigma delta modulator having an associated noise transfer function, said sigma delta modulator coupled to said first input and operative to generate a dithered amplitude signal therefrom and to encode data such that quantization noise exhibited by an amplifier is distributed outside at least one frequency band of interest, said sigma delta modulator comprising:
a programmable order low pass sigma delta stage;
one or more comb filters, each comb filter comprising a plurality of fingers;
a combiner operative to combine the output of said programmable order low pass sigma delta stage and said one or more comb filters;
said amplifier comprising a plurality of discrete levels of amplitude and adapted to receive the output of said frequency synthesizer and said sigma delta modulator, said amplifier operative to control the amplitude of said angle modulated carrier signal in accordance with the output of said sigma delta modulator.

25. The transmitter according to claim 24, wherein said one or more comb filters comprises a comb filter comprising a plurality of fingers coupled to said integer portion signal of said first input.

26. The transmitter according to claim 24, wherein said one or more comb filters comprises a comb filter comprising a plurality of fingers coupled to said fractional portion signal of said first input.

27. The transmitter according to claim 24, wherein said amplifier comprises a plurality of transistor arrays, each said transistor array coupled to the output of one said fingers of said comb filter and comprising a plurality of transistors adapted to generate an output signal whose amplitude is substantially proportional to the number of transistors active at any one time in said array.

* * * * *